US012154970B2

(12) United States Patent
Lin et al.

(10) Patent No.: US 12,154,970 B2
(45) **Date of Patent: *Nov. 26, 2024**

(54) METHOD FOR SEMICONDUCTOR DEVICE STRUCTURE

(71) Applicant: Taiwan Semiconductor Manufacturing Company, Ltd., Hsinchu (TW)

(72) Inventors: Tze-Chung Lin, Hsinchu (TW); Han-Yu Lin, Nantou County (TW); Li-Te Lin, Hsinchu (TW); Pinyen Lin, Rochester, NY (US)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 225 days.

This patent is subject to a terminal disclaimer.

(21) Appl. No.: 17/854,615

(22) Filed: Jun. 30, 2022

(65) Prior Publication Data

US 2022/0336635 A1 Oct. 20, 2022

Related U.S. Application Data

(63) Continuation of application No. 16/837,432, filed on Apr. 1, 2020, now Pat. No. 11,417,751.

(51) Int. Cl.
*H01L 29/66* (2006.01)
*H01L 21/8234* (2006.01)
(Continued)

(52) U.S. Cl.
CPC .................. *H01L 29/66545* (2013.01); *H01L 21/823431* (2013.01); *H01L 29/42392* (2013.01);
(Continued)

(58) Field of Classification Search
CPC ........... H01L 29/6653; H01L 29/66545; H01L 29/42392; H01L 29/66795; H01L 29/785
See application file for complete search history.

(56) References Cited

U.S. PATENT DOCUMENTS 9,209,247 B2 12/2015 Colinge et al.
9,236,267 B2 1/2016 De et al.
(Continued)

*Primary Examiner* — Tuan A Hoang
(74) *Attorney, Agent, or Firm* — Birch, Stewart, Kolasch & Birch, LLP

(57) ABSTRACT

A method for forming a semiconductor device structure is provided. The method includes forming first semiconductor layers and second semiconductor layers on a substrate, and the first semiconductor layers and the second semiconductor layers are alternately stacked. The method includes forming a dummy gate structure over the first semiconductor layers and the second semiconductor layers, and removing a portion of the first semiconductor layers and second semiconductor layers to form a S/D trench. The method also includes removing the second semiconductor layers to form a recess connected to the S/D trench. The method includes forming a dummy dielectric layer in the recess after the dummy gate structure is formed, and the dummy dielectric layer is exposed by the S/D trench. The method includes removing a portion of the dummy dielectric layer to form a cavity and forming an inner spacer layer in the cavity.

20 Claims, 17 Drawing Sheets

(51) Int. Cl.
*H01L 29/423* (2006.01)
*H01L 29/78* (2006.01)

(52) U.S. Cl.
CPC .... *H01L 29/6653* (2013.01); *H01L 29/66553* (2013.01); *H01L 29/6656* (2013.01); *H01L 29/66795* (2013.01); *H01L 29/785* (2013.01)

(56) References Cited

U.S. PATENT DOCUMENTS

| | | | | |
|---|---|---|---|---|
| 9,412,817 | B2 | 8/2016 | Yang et al. | |
| 9,412,828 | B2 | 8/2016 | Ching et al. | |
| 9,472,618 | B2 | 10/2016 | Oxland | |
| 9,502,265 | B1 | 11/2016 | Jiang et al. | |
| 9,520,482 | B1 | 12/2016 | Chang et al. | |
| 9,536,738 | B2 | 1/2017 | Huang et al. | |
| 9,576,814 | B2 | 2/2017 | Wu et al. | |
| 9,608,116 | B2 | 3/2017 | Ching et al. | |
| 9,929,235 | B1 * | 3/2018 | Yang | H01L 29/785 |
| 9,953,977 | B1 | 4/2018 | Cheng et al. | |
| 11,717,751 | B2 * | 8/2023 | Shao | A63F 13/2145<br>463/31 |
| 2014/0225065 | A1 | 8/2014 | Rachmady et al. | |
| 2015/0372115 | A1 | 12/2015 | Koh et al. | |
| 2017/0005195 | A1 | 1/2017 | Ching et al. | |
| 2017/0358665 | A1 | 12/2017 | Song et al. | |
| 2018/0033871 | A1 * | 2/2018 | Xie | H01L 21/02532 |
| 2018/0175163 | A1 * | 6/2018 | Barraud | H01L 29/6653 |
| 2020/0266060 | A1 | 8/2020 | Cheng et al. | |
| 2020/0381555 | A1 * | 12/2020 | Lee | H01L 27/0886 |

* cited by examiner

METHOD FOR SEMICONDUCTOR DEVICE STRUCTURE

CROSS REFERENCE TO RELATED APPLICATIONS

This application is a Continuation application of U.S. patent application Ser. No. 16/837,432, filed on Apr. 1, 2020, the entire of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

As the semiconductor industry has progressed into nanometer technology process nodes in pursuit of higher device density, higher performance, and lower costs, challenges from both fabrication and design issues have resulted in the development of three-dimensional designs.

Although existing semiconductor devices have generally been adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 1A-13A show perspective representations of various stages of forming a semiconductor device structure, in accordance with some embodiments of the disclosure.

FIGS. 1B-13B show cross-sectional representations of the semiconductor device structure along line AA' shown in FIG. 1A-13A, in accordance with some embodiments of the disclosure.

FIGS. 14A-16A show perspective representations of various stages of forming a semiconductor device structure, in accordance with some embodiments of the disclosure.

FIGS. 14B-16B show cross-sectional representations of the semiconductor device structure along line AA' shown in FIG. 14A-16A, in accordance with some embodiments of the disclosure.

DETAILED DESCRIPTION

Figure 1B:
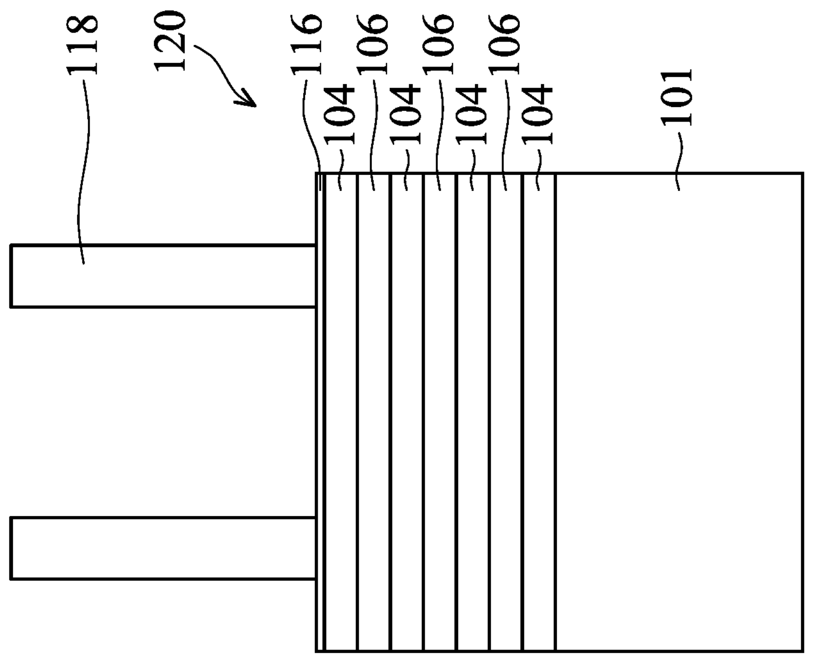

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

The gate all around (GAA) transistor structures described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Embodiments for forming a semiconductor device structure are provided. FIGS. 1A-13A show perspective representations of various stages of forming a semiconductor device structure 100*a*, in accordance with some embodiments of the disclosure. FIGS. 1B-13B show cross-sectional representations of the semiconductor device structure along line AA' shown in FIG. 1A-13A, in accordance with some embodiments of the disclosure. The semiconductor device structure 100*a* is a gate all around (GAA) transistor structure.

Figure 1A:
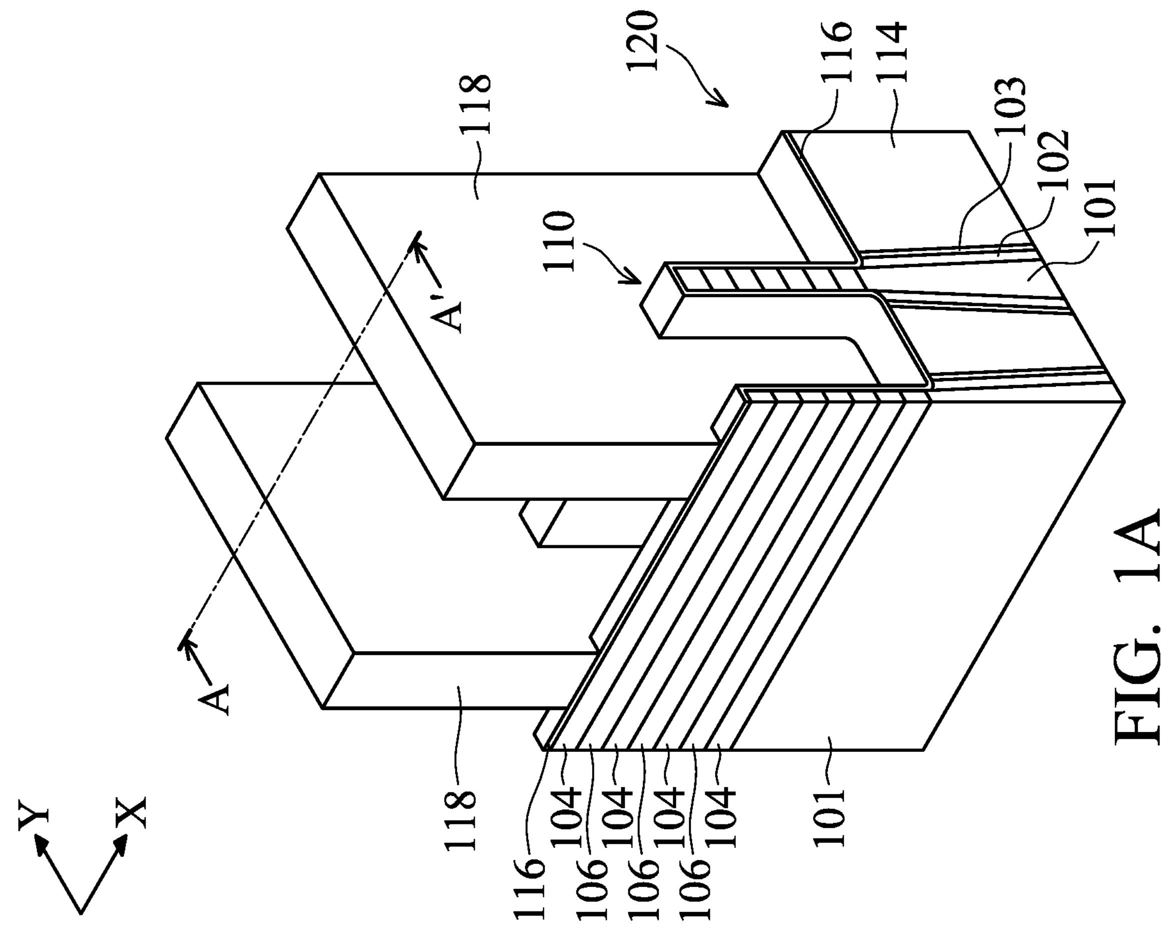

As shown in FIGS. 1A and 1B, a substrate 101 is provided. The substrate 101 may be made of silicon or other semiconductor materials. Alternatively or additionally, the substrate 101 may include other elementary semiconductor materials such as germanium. In some embodiments, the substrate 101 is made of a compound semiconductor such as silicon carbide, gallium arsenic, indium arsenide, or indium phosphide. In some embodiments, the substrate 101 is made of an alloy semiconductor such as silicon germanium, silicon germanium carbide, gallium arsenic phosphide, or gallium indium phosphide. In some embodiments, the substrate 101 includes an epitaxial layer. For example, the substrate 101 has an epitaxial layer overlying a bulk semiconductor.

A number of first semiconductor layers 104 and a number of second semiconductor layers 106 are sequentially alternately formed over the substrate 101. The semiconductor layers 104 and 106 are vertically stacked to form a stacked nanowire structure (or stacked nanostructures).

In some embodiments, the first semiconductor layers 104 and the second semiconductor layers 106 independently include silicon (Si), germanium (Ge), silicon germanium ($Si_{1-x}Ge_x$, 0.1<x<0.7, the value x is the atomic percentage of germanium (Ge) in the silicon germanium), indium arsenide (InAs), indium gallium arsenide (InGaAs), indium antimonide (InSb), or another applicable material. In some embodiments, the first semiconductor layer 104 and the second semiconductor layer 106 are made of different materials.

The first semiconductor layers 104 and the second semiconductor layers 106 are made of different materials having different lattice constant. In some embodiments, the first semiconductor layer 104 is made of silicon (Si), and the second semiconductor layer 106 is made of silicon germanium ($Si_{1-x}Ge_x$, 0.1<x<0.7). In some other embodiments, the first semiconductor layer 104 is made of silicon germanium ($Si_{1-x}Ge_x$, 0.1<x<0.7), and the second semiconductor layer 106 is made of silicon (Si).

In some embodiments, the first semiconductor layers 104 and the second semiconductor layers 106 are formed by a selective epitaxial growth (SEG) process, a chemical vapor deposition (CVD) process (e.g. low-pressure CVD (LPCVD), plasma enhanced CVD (PECVD)), a molecular epitaxy process, or another applicable process. In some embodiments, the first semiconductor layers 104 and the second semiconductor layers 106 are formed in-situ in the same chamber.

In some embodiments, the thickness of each of the first semiconductor layers 104 is in a range from about 1.5 nanometers (nm) to about 20 nm. Terms such as "about" in conjunction with a specific distance or size are to be interpreted as not to exclude insignificant deviation from the specified distance or size and may include for example deviations of up to 20%. In some embodiments, the first semiconductor layers 104 are substantially uniform in thickness. In some embodiments, the thickness of each of the second semiconductor layers 106 is in a range from about 1.5 nm to about 20 nm. In some embodiments, the second semiconductor layers 106 are substantially uniform in thickness.

Then, the first semiconductor layers 104 and the second semiconductor layers 106 are patterned to form a fin structure 110. Afterwards, a first liner layer 102 and a second liner layer 103 are formed on sidewall surfaces of the fin structure 110 and on the second liner layer 103. An isolation structure 114 is formed over the substrate 101. The top portions of the fin structures 110 are above the isolation structure 114.

Next, a dummy gate dielectric layer 116 is formed over the fin structure 110, and then a dummy gate electrode layer 118 is formed on the dummy gate dielectric layer 116. Afterwards, the dummy gate electrode layer 118 is patterned by a patterning process. The gate structure 120 is constructed by the dummy gate dielectric layer 116 and the dummy gate electrode layer 118.

The patterning process includes a photolithography process and an etching process. The photolithography process includes photoresist coating (e.g., spin-on coating), soft baking, mask aligning, exposure, post-exposure baking, developing the photoresist, rinsing and drying (e.g., hard baking). The etching process includes a dry etching process or a wet etching process.

The dummy gate electrode layer 118 is formed to partially cover and to extend across the fin structure 110. In some embodiments, the dummy gate electrode layer 118 wraps around the fin structure 110. The dummy gate dielectric layers 116 may be made of or include silicon oxide. In some embodiments, the dummy gate electrode layer 118 is made of polycrystalline-silicon (poly-Si) or poly-crystalline silicon-germanium (poly-SiGe).

Figure 2B:
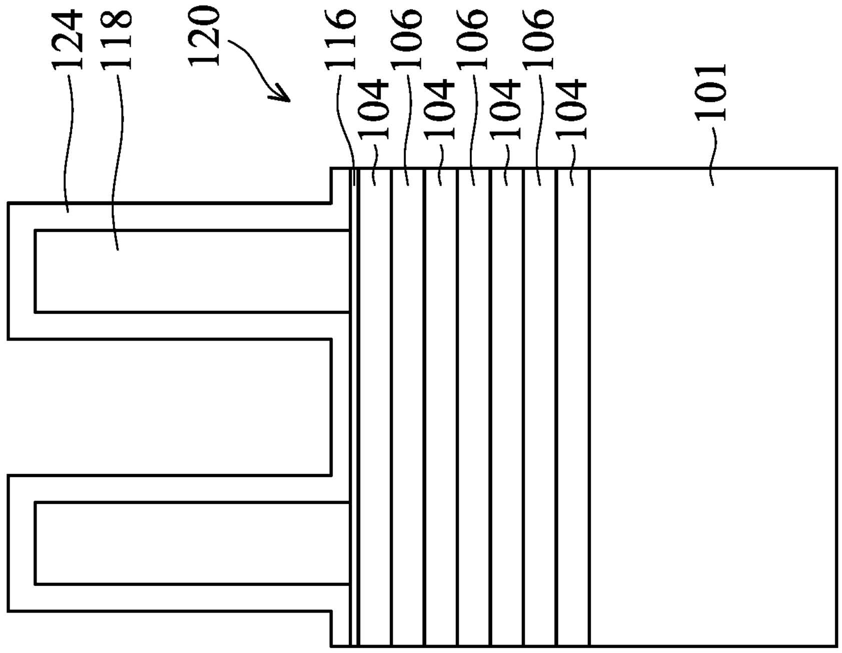
Figure 2A:
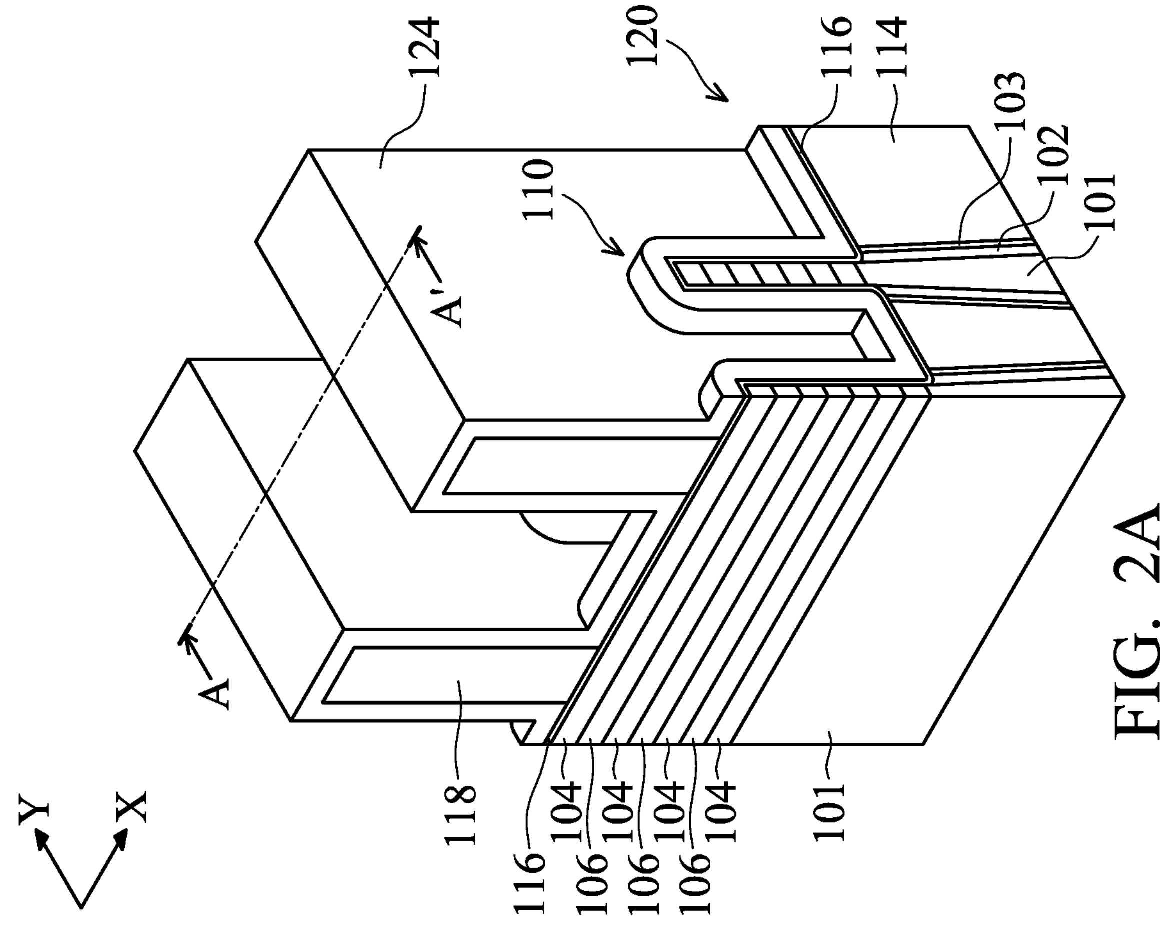

Afterwards, as shown in FIGS. 2A and 2B, a gate spacer layer 124 is formed on opposite sidewall surfaces of the dummy gate electrode layer 118 and over the dummy gate dielectric layer 116, in accordance with some embodiments. The gate spacer layer 124 can provide more protection to the dummy gate structure 120 during subsequent processes.

In some embodiments, the gate spacer layer 124 is made of a dielectric material, such as silicon oxide ($SiO_2$), silicon nitride (SiN), silicon carbide (SiC), silicon oxynitride (SiON), silicon carbon nitride (SiCN), silicon oxide carbonitride (SiOCN), or a combination thereof. In some embodiments, the gate spacer layer 124 is formed by a deposition process, such as CVD process, ALD process, another applicable process, or a combination thereof.

Figure 3B:
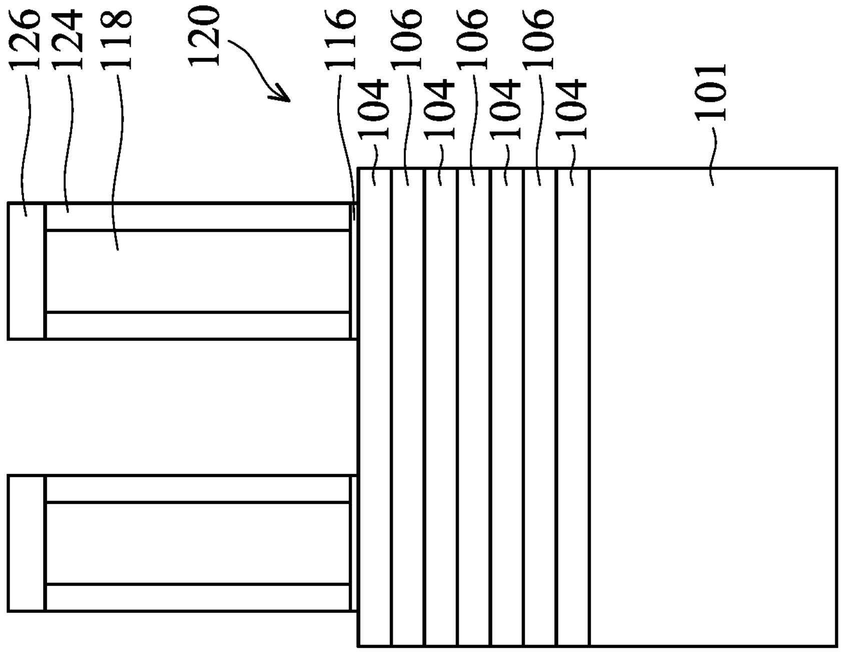
Figure 3A:
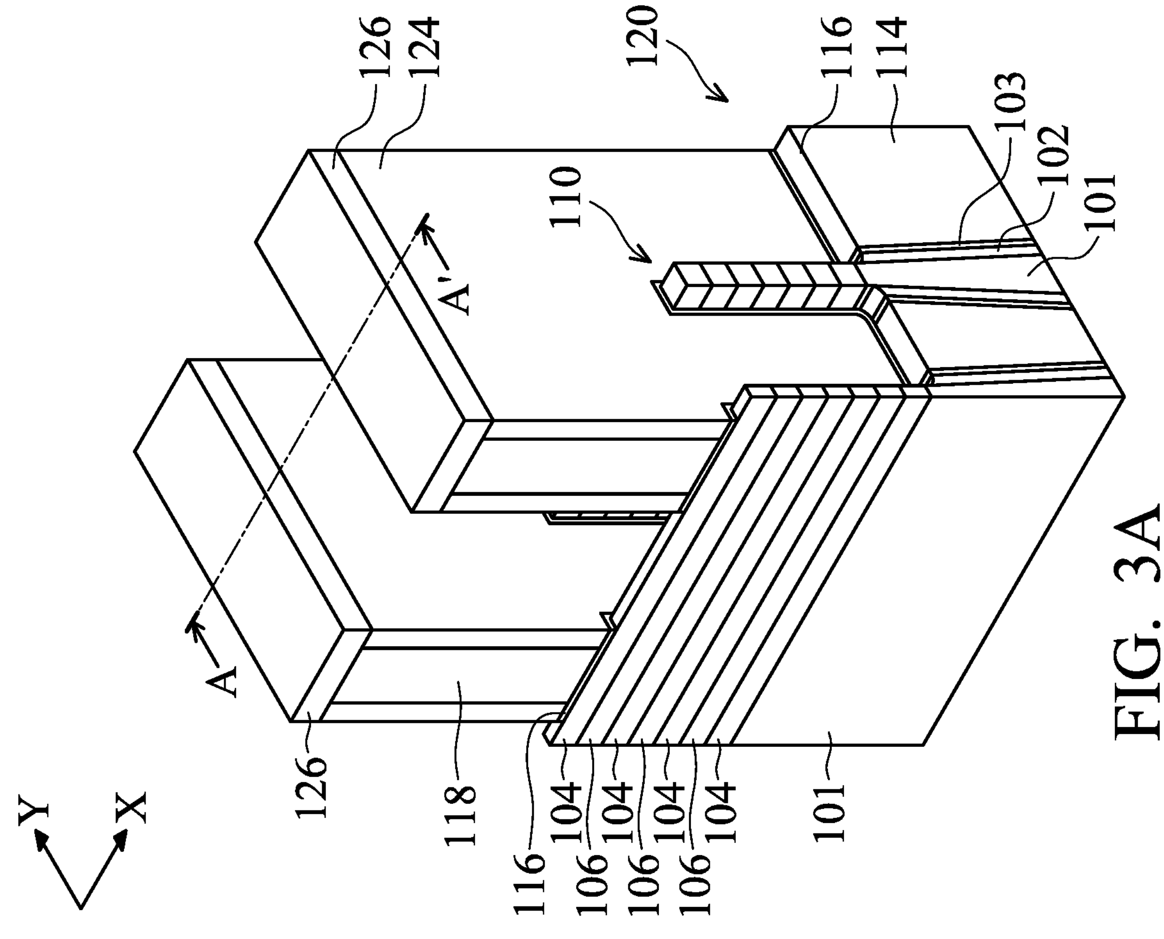

Next, as shown in FIGS. 3A and 3B, the gate spacer layer 124 and the dummy gate dielectric layer 116 are patterned, in accordance with some embodiments. Afterwards, a mask layer 126 is formed on the dummy gate electrode layer 118 and the gate spacer layer 124. A portion of the gate spacer layer 124 is removed by using the mask layer 126 as a mask.

In some embodiments, the mask layer 126 is made of silicon nitride, silicon carbon nitride (SiCN), or applicable material, or a combination thereof. In some embodiments, the mask layer 126 is formed by a deposition process, such as low-pressure CVD (LPCVD) process, plasma enhanced CVD (PECVD) process, or another deposition process.

Figure 4B:
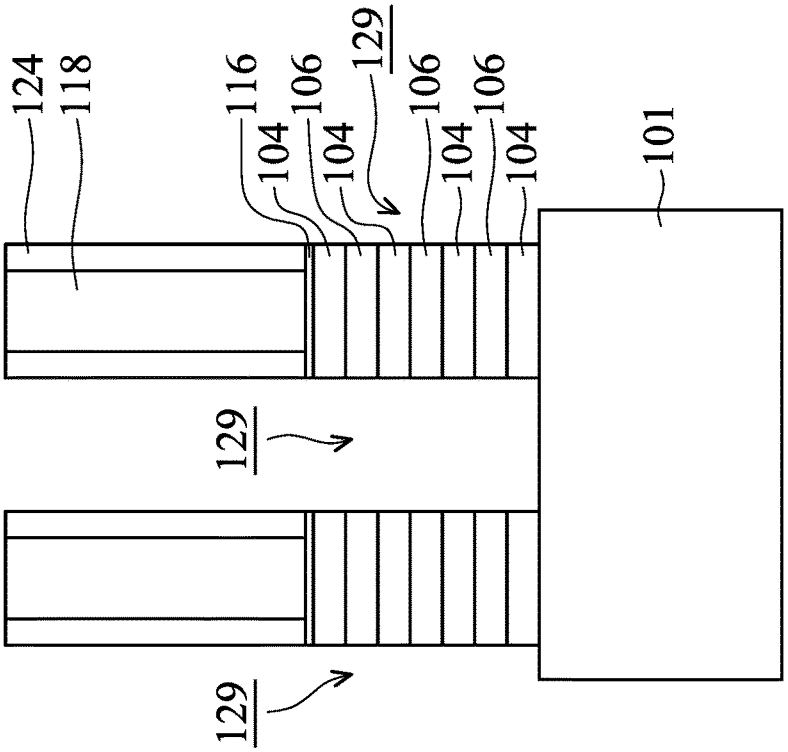
Figure 4A:
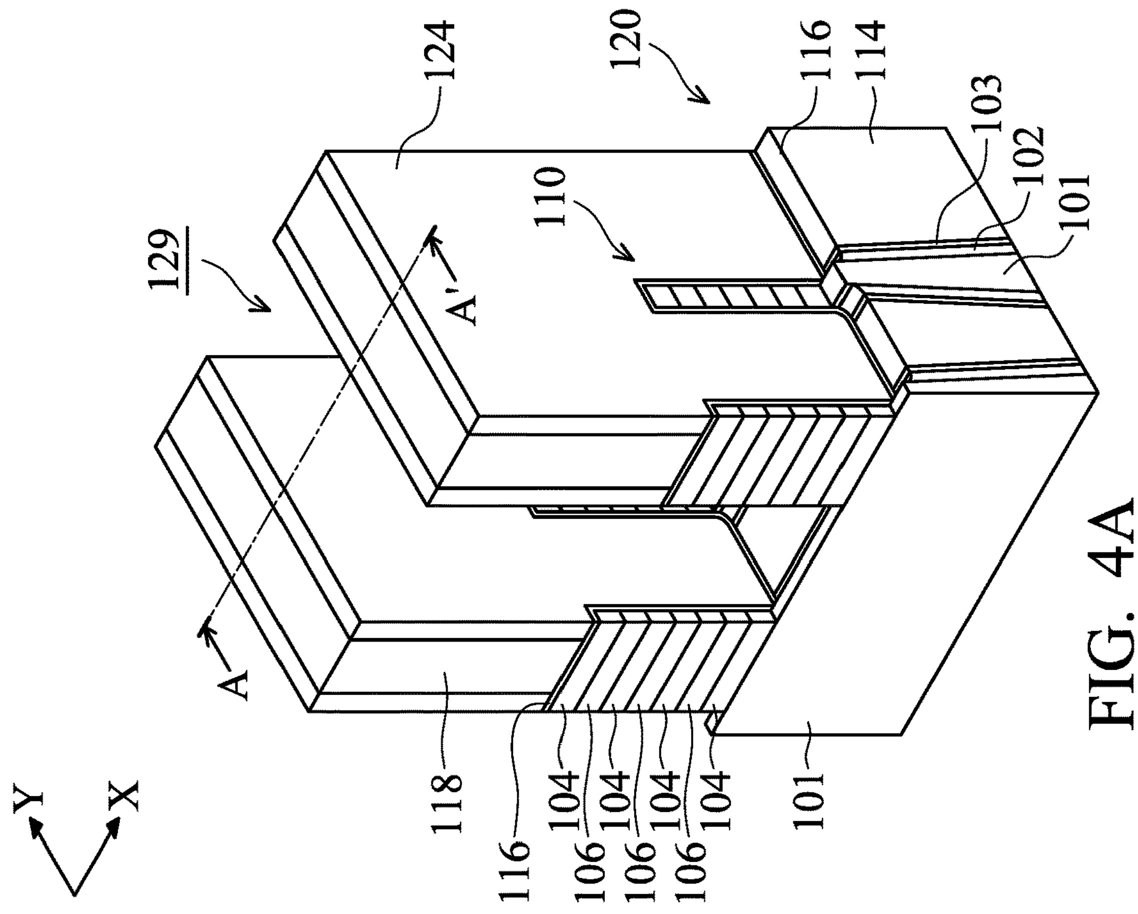

Subsequently, as shown in FIGS. 4A and 4B, a portion of the fin structure 110 is removed to form an S/D trench 129, in accordance with some embodiments. More specifically, a portion of the first semiconductor layers 104 and a portion of the second semiconductor layers 106 are removed by using the mask layer 126 as a mask to form the S/D trench 129.

Figure 5B:
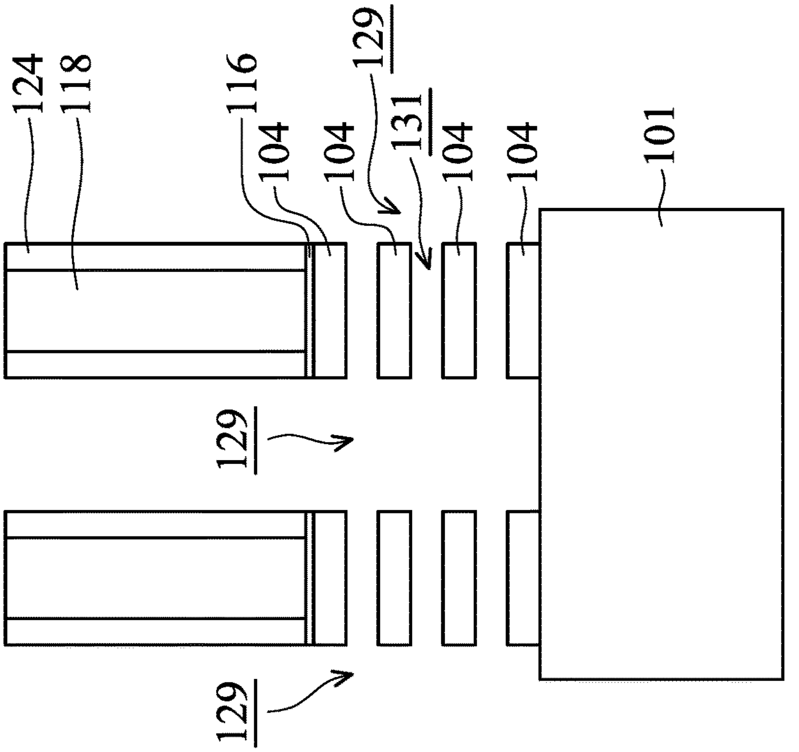
Figure 5A:
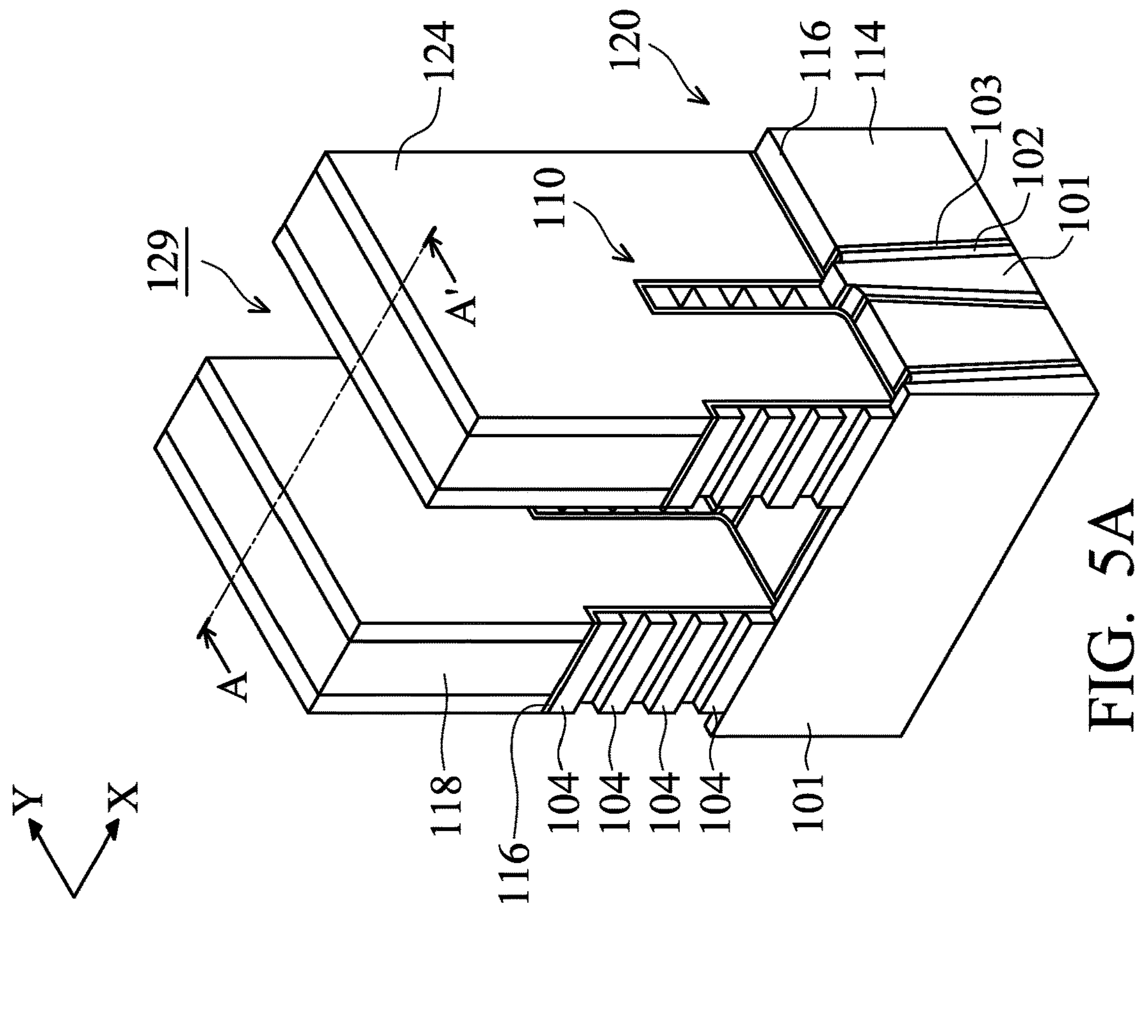

Next, as shown in FIGS. 5A and 5B, the second semiconductor layers 106 are removed to form a recess 131, in accordance with some embodiments. The recess 131 is between two adjacent first semiconductor layers 104. The recess 131 is exposed by the S/D trench 129. All of the second semiconductor layers 106 are removed.

The second semiconductor layers 106 are removed by using an etching process, such as a dry etching process or a wet etching process. In some embodiments, the second semiconductor layers 106 are made of SiGe and are removed by a wet etching process, and the wet etching process includes using HF and $F_2$.

Figure 6B:
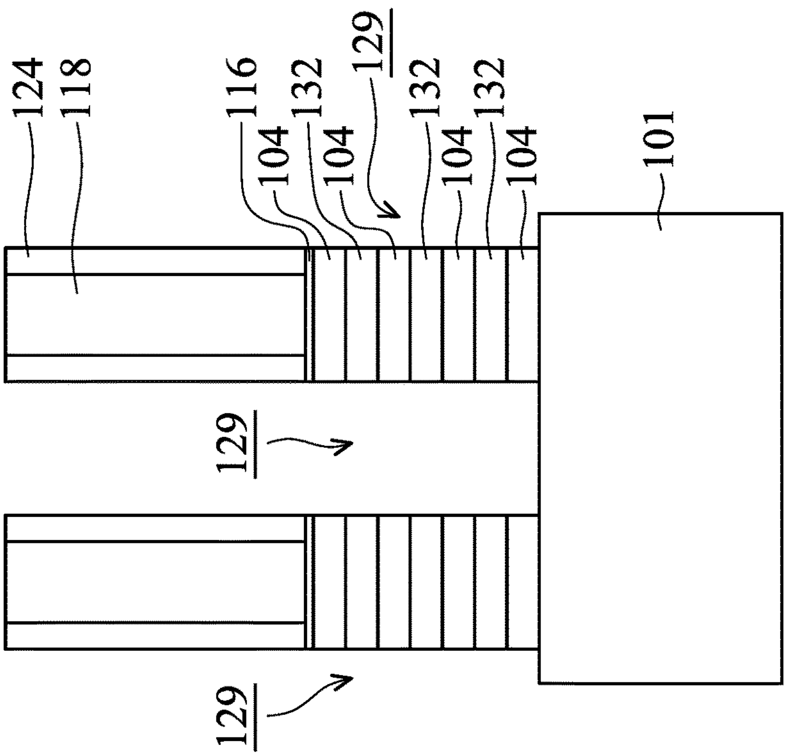
Figure 6A:
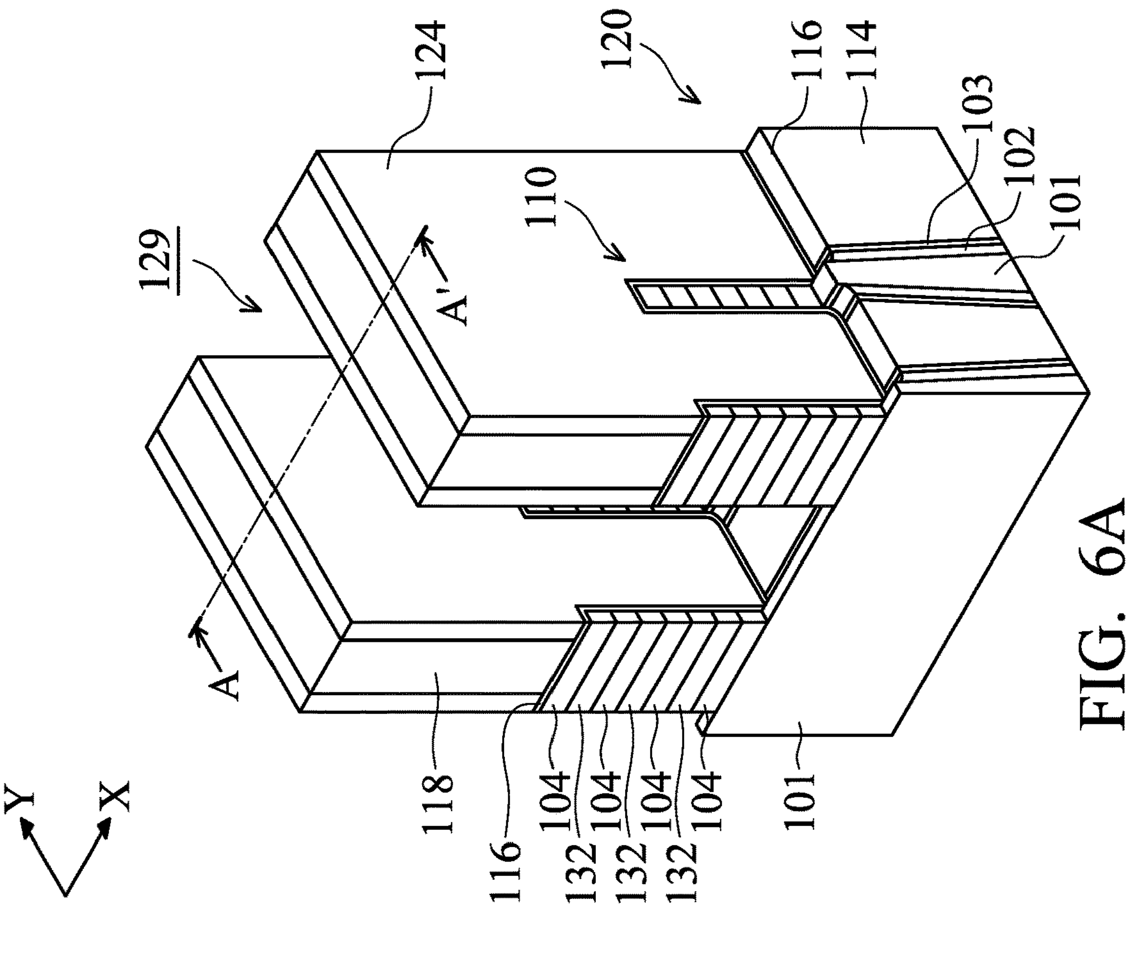

Afterwards, as shown in FIGS. 6A and 6B, a dummy dielectric layer 132 is formed in the recess 131, in accordance with some embodiments. The dummy dielectric layer 132 is used to replace the second semiconductor layers 106. As a result, the first semiconductor layers 104 and the dummy dielectric layer 132 are alternately stacked.

The dummy dielectric layer 132 is made of dielectric layer. In some embodiments, the dummy dielectric layer 132 is made of dielectric layer with a dielectric constant in a range from about 4 to about 7. In some embodiments, the dummy dielectric layer 132 has a density in a range from about 2 $g/cm^3$ to about 3 $g/cm^3$. The dummy dielectric layer 132 with lower k-value and lower density in the mentioned region can provide higher removal-efficiency or precise control during chemical etching or wet etching process due to its composition of Si, O, C, N. After post cleaning process, the remaining residues of Si, O, C, N for forming the dummy dielectric layer 132 can be removed by wet cleaning process.

In some embodiments, the dummy dielectric layer 132 is made of silicon oxide ($SiO_2$), SiOCN, silicon nitride ($Si_3N_4$) or another applicable materials. In some embodiments, the dummy dielectric layer 132 is formed by an ALD (atomic layer deposition process), flowable CVD or another application process. The advantage of the ALD process is to form uniform and conformal films in the narrow recess 131.

In some embodiments, the dummy dielectric layer 132 is formed by the ALD process, and the ALD process is operated at a temperature in a range from about 500 Celsius degrees to about 700 Celsius degrees. In some embodiments, the precursor used in ALD process includes dichlorosilane (DCS) gas, $C_3H_6$ gas, and NH3 gas. In some other embodiments, the precursor used in ALD process includes hexachloro-disilane (HCD), $C_3H_6$ gas, oxygen ($O_2$) gas and $NH_3$ gas.

Figure 7B:
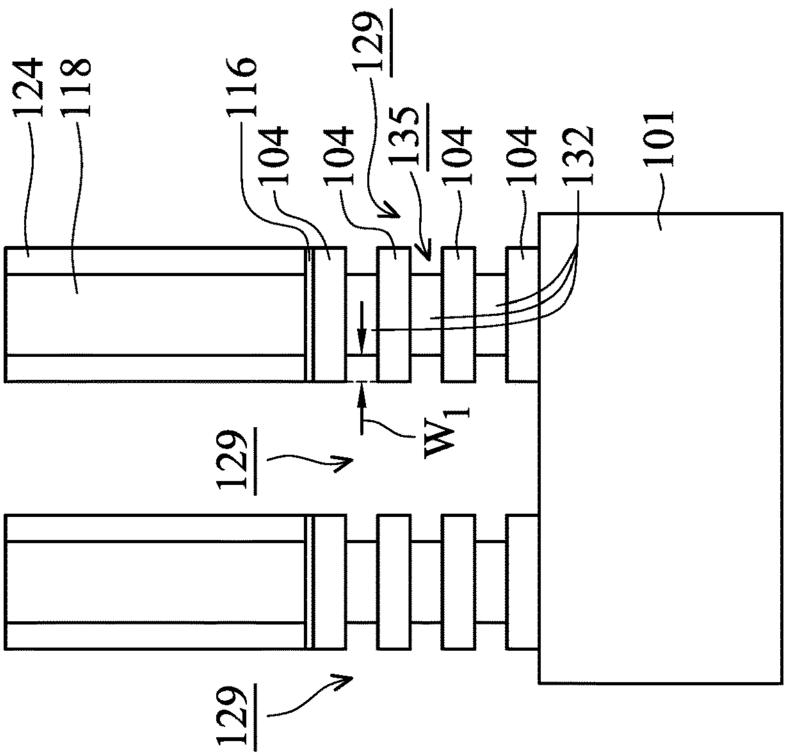
Figure 7A:
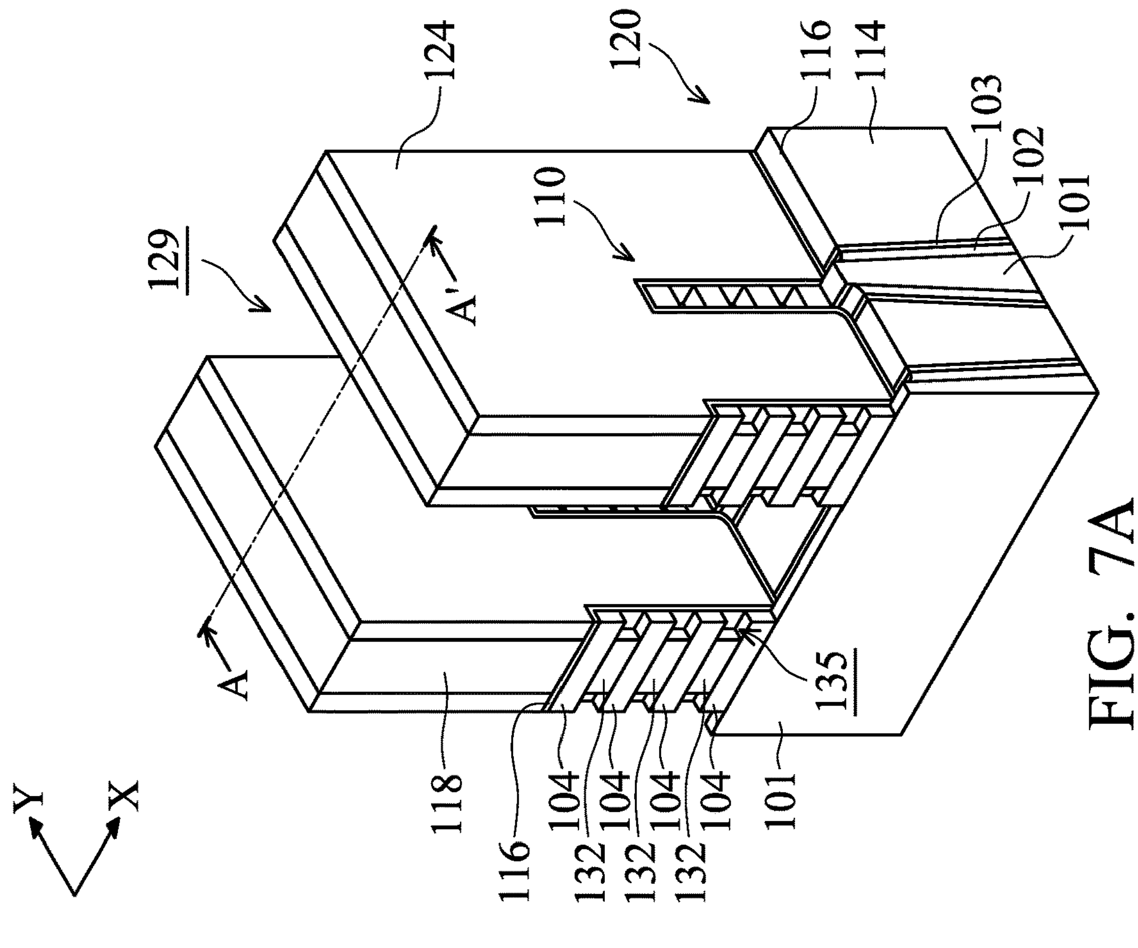

Next, as shown in FIGS. 7A and 7B, a portion of the dummy dielectric layer 132 is removed, in accordance with some embodiments. The two ends of the dummy dielectric layer 132 are removed to form a number of cavities 135. The cavities 135 are used to provide a space for forming the inner spacer layer 136. The cavities 135 are directly below the gate spacer layer 124. In some embodiments, after the cavities 135 are formed, a clean process is performed on the cavities. In some embodiments, the cleaning process includes using DI water.

The etching process of the dummy dielectric layer 132 is easily controlled than the etching process of the second semiconductor layers 106 since the second semiconductor layers 106 has uneven concentration. The etching profile or the shape of the dummy dielectric layer 132 is easily to controlled than the etching profile or the shape of the second semiconductor layers 106. Therefore, the second semiconductor layers 106 are replaced by the dummy dielectric layer 132 firstly, and the cavities 135 (FIGS. 7A and 7B) are formed by etching the dummy dielectric layer 132, rather than the etching the second semiconductor layers 106. Since the etching process for etching the dummy dielectric layer 132 is easily to control, each of the cavities 135 has a substantially consistent shape or profile. The variation of the shape of the cavities 135 is low.

If the second semiconductor layer 106 is not replaced by the dummy dielectric layer 132 firstly, the cavities will be formed in each of the second semiconductor layers 106. When the second semiconductor layers 106 are made of SiGe and the thermal treatment is performed, the concentrations of Ge of the second semiconductor layers 106 may not uniformly distributed in the second semiconductor layers 106. For example, the Ge atoms may diffuse to the interface between second semiconductor layer 106 (SiGe layer) and first semiconductor layer 104 (Si layer). When the SiGe layer is etched, the etched amount in the middle portion of the SiGe layer may greater than the etched amount in the top or bottom portion of the SiGe layer. Therefore, the sidewall of the civility 135 may have unwanted smiling profile.

In addition, since the Ge concentration distribution in each SiGe layer may be different, the etching profiles in each of the second semiconductor layers 106 may be different. This phenomena cause the cavity depth variation. In order to reduce the cavity depth variation and control the shape or profile of the cavity 135, the second semiconductor layer 106 is replaced by the dummy dielectric layer 132.

It should be noted that, the cavities 135 are formed by removing the dummy gate dielectric layer 116, rather than the second semiconductor layers 106. Therefore, the unwanted by-products, such as Ge-containing residue or F-containing residue, which are formed due to removal of the second semiconductor layers 106, are not remaining in the cavities 135. The method of this disclosure provides clean surfaces of the cavities 135, and the clean surfaces are helpful for deposition of an inner spacer layer 136 (shown in FIGS. 8A and 8B).

In some embodiments, each of the cavities 135 has a rectangular shape or square shape. In some embodiments, each of the cavities has the same or substantially the same shape. In some embodiments, each of the cavities 135 does not have a V-shaped. The cavity 135 has a width $W_1$ in a horizontal direction. In some embodiments, the width $W_1$ of the cavity 135 is in a range from about 5 nm to about 15 nm. In some embodiments, the sidewall of the cavity 135 is substantially aligned with the inner sidewall surface of the gate spacer layer 124.

Figure 8A:
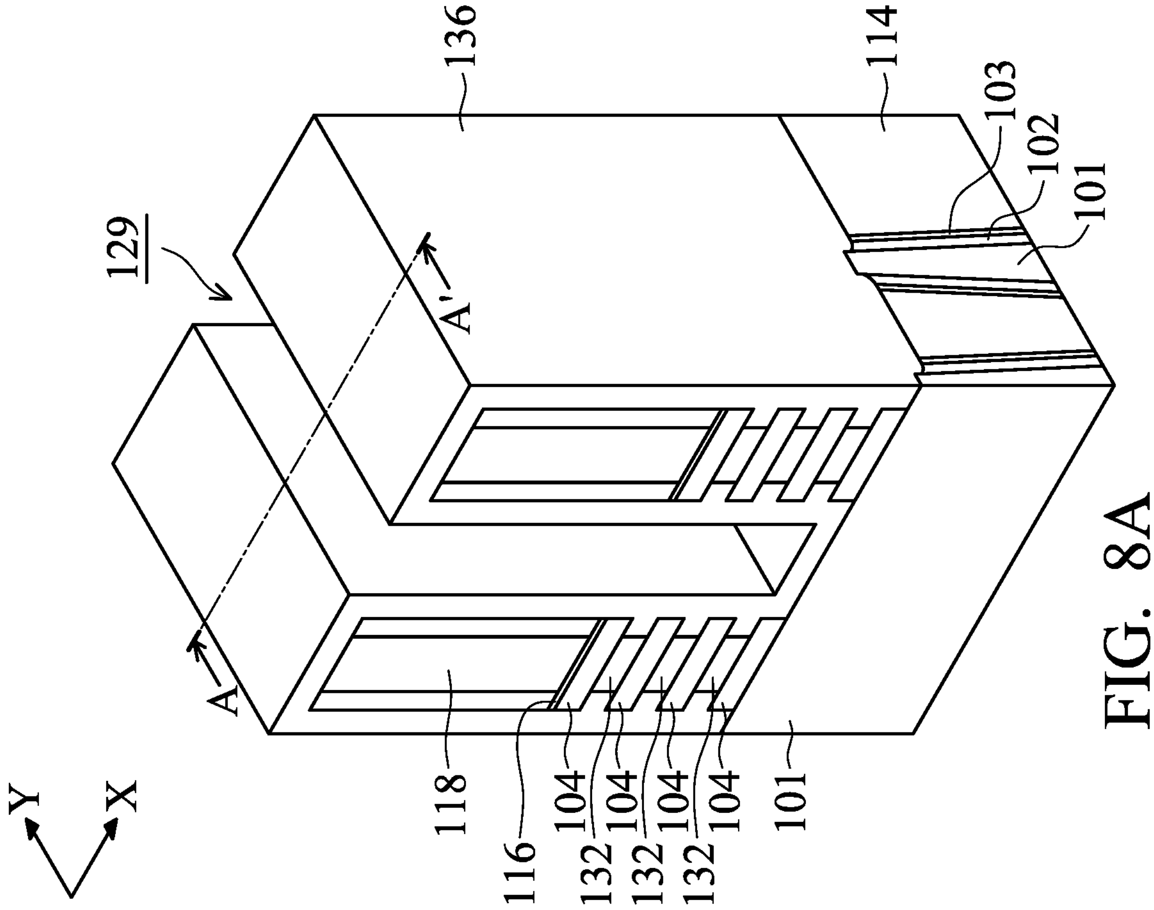
Figure 8B:
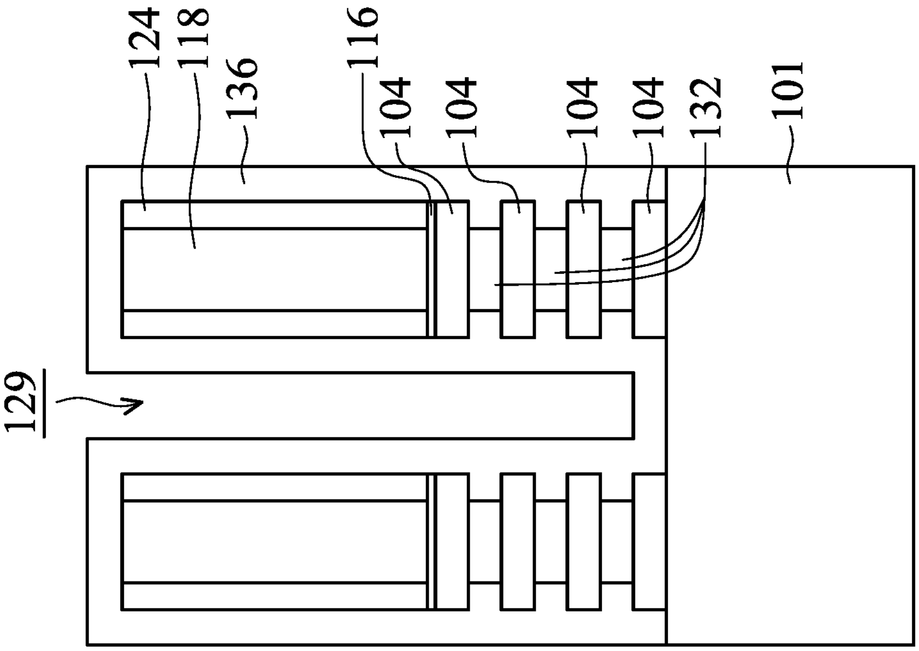

Subsequently, as shown in FIGS. 8A and 8B, an inner spacer layer 136 is formed in the cavity 135 and on the gate spacer layer 124, in accordance with some embodiments. In addition, the inner spacer layer 136 is formed on the substrate 101 and the dummy gate electrode layer 118.

Figure 13B:
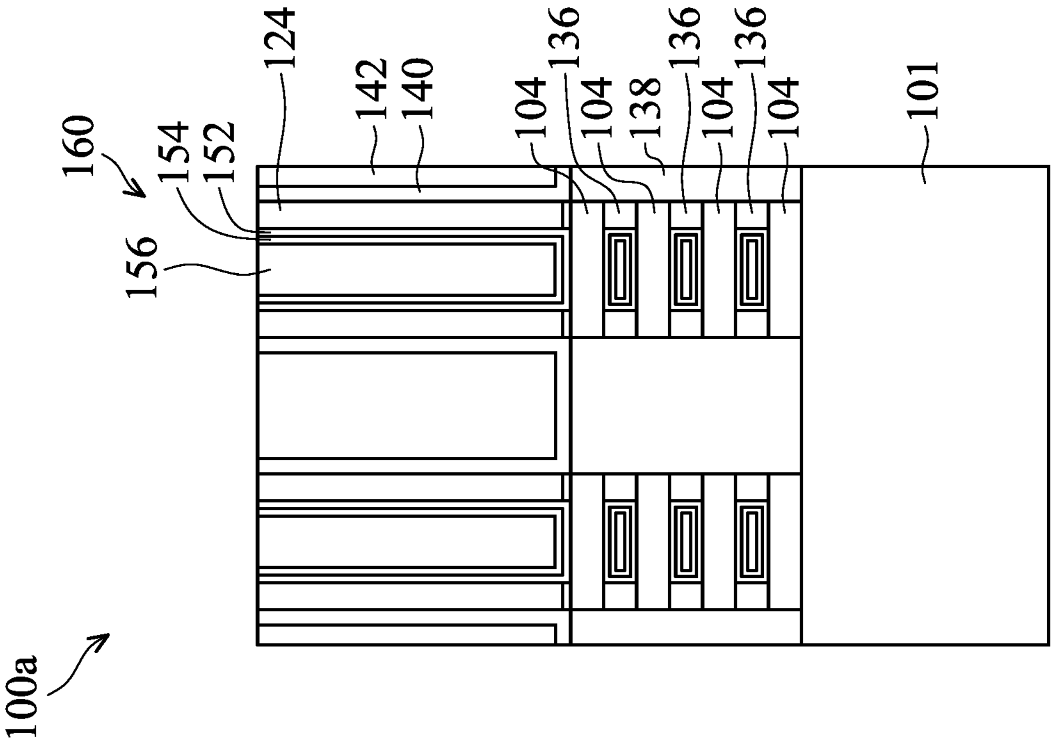

The inner spacer layer 136 is configured to as a barrier between an S/D structure 138 (formed later, FIG. 10B) and a gate structure 160 (formed later, as shown in FIG. 13B). The inner spacer layer 136 can reduce the parasitic capacitance between the S/D structure 138 (formed later, FIG. 1I) and the gate structure 160 (formed later, as shown in FIG. 2E).

The inner spacer layer 136 is directly below the gate spacer layer 124. The inner spacer layer 136 is formed on the sidewall surfaces of the dummy dielectric layer 132. The inner spacer layer 136 and the dummy dielectric layer 132 are made of different materials. In some embodiments, the inner spacer layer 136 and the dummy dielectric layer 132 have different etching selectivity. In some embodiments, the inner spacer layer 136 is made of silicon carbon nitride (SiCN), silicon carbide (SiC), silicon oxycarbide (SiOC), silicon oxide carbonitride (SiOCN), or a combination thereof. In some embodiments, the inner spacer layer 136 is formed by a deposition process, such as CVD process, ALD process, another applicable process, or a combination thereof.

Figure 9B:
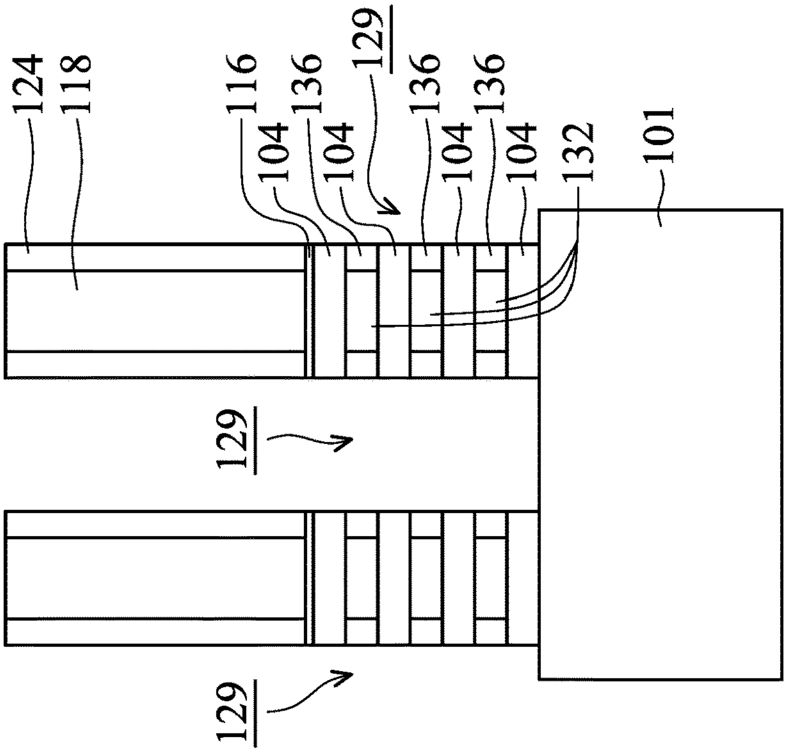
Figure 9A:
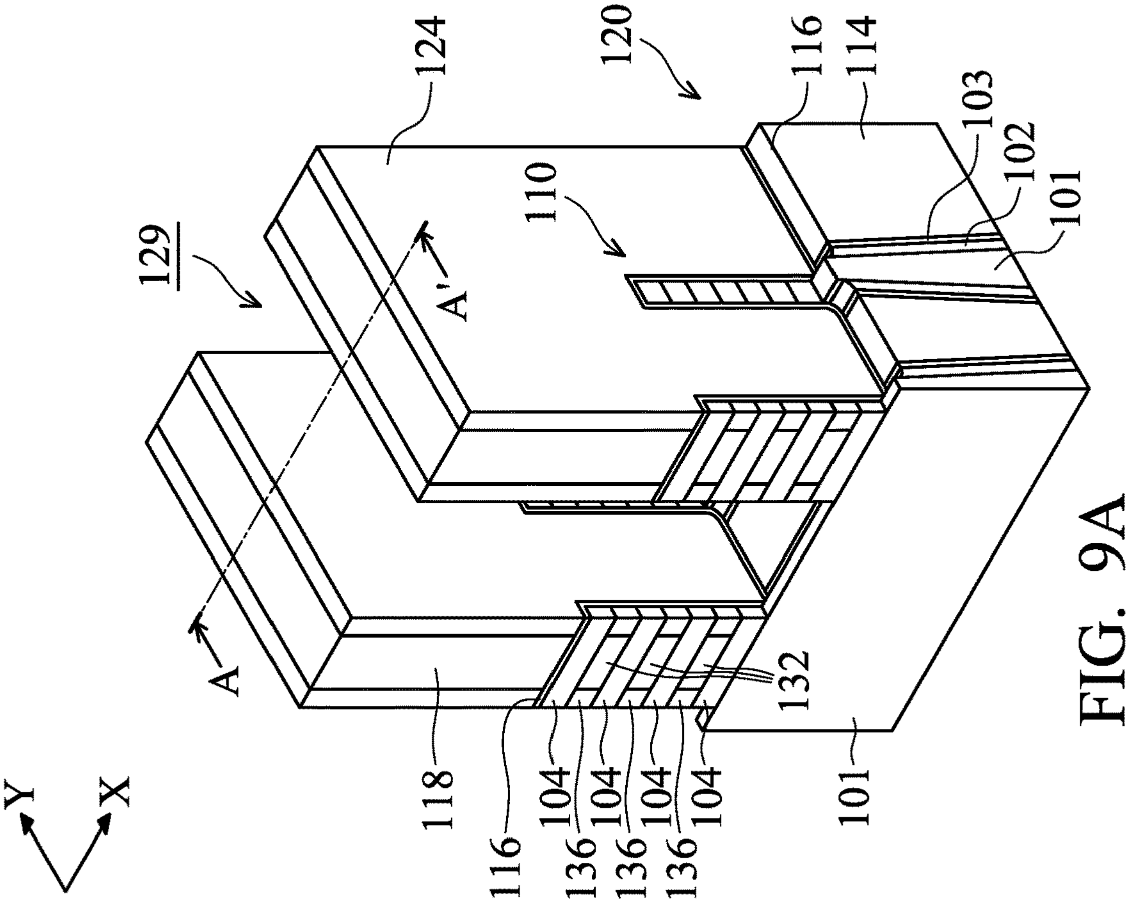

Next, as shown in FIGS. 9A and 9B, a portion of the inner spacer layer 136 outside of the cavity 135 is removed, in accordance with some embodiments. The remaining portion of the inner spacer layer 136 is formed in the cavity 135. The inner spacer layer 136 is in direct contact with the dummy dielectric layer 132.

In some embodiments, the inner space layer 136 has a rectangular shape or square shape. The inner sidewall surface of the inner spacer layer 136 in direct contact with the dummy dielectric layer 132 is substantially vertical to the top surface of one of the first semiconductor layers 104. The outer sidewall surface of the inner spacer layer 136 in substantially aligned with the sidewall surface of one of the first semiconductor layers 104. The inner sidewall surface of the inner spacer layer 136 is symmetric to the outer sidewall surface of the inner spacer layer 136.

It should be noted that the inner space layer 136 in each of the cavities 135 has a consistent thickness since each of the cavities 135 has a substantially consistent shape or profile. In some embodiments, the interface is between the inner spacer layer 136 and the dummy dielectric layer 132. In some embodiments, the interface between the inner spacer layer 136 and the dummy dielectric layer 132 is substantially aligned with the inner sidewall surface of the gate spacer layer 124. In some embodiments, the interface between the inner spacer layer 136 and the dummy dielectric layer 132 is substantially aligned with the top surface of the substrate 101.

Figure 10B:
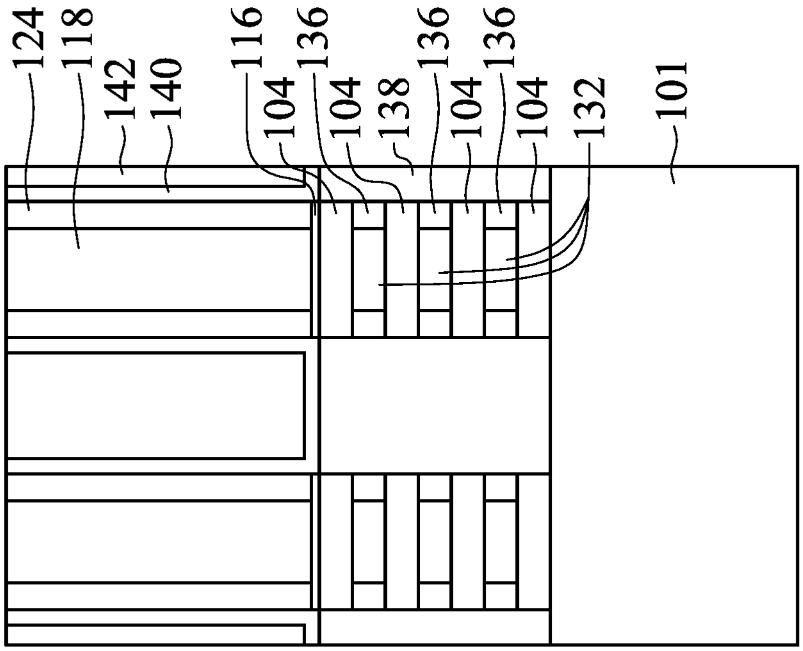
Figure 10A:
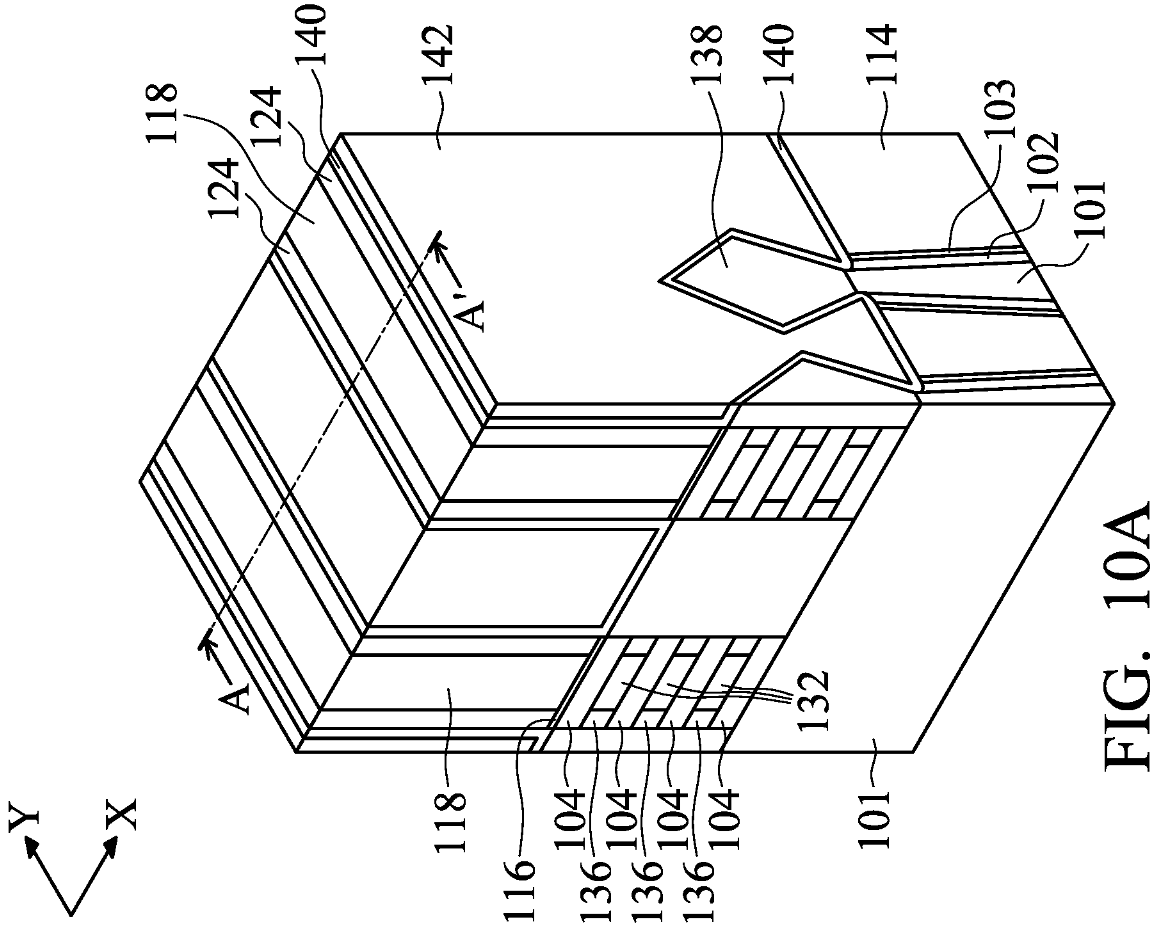

Afterwards, as shown in FIGS. 10A and 10B, an S/D structure 138 is formed in the S/D trench 129, and a contact etch stop layer (CESL) 140 is formed over the S/D structures 138, and an inter-layer dielectric (ILD) layer 142 is formed over the CESL 140, in accordance with some embodiments. Next, a portion of the ILD layer 142 is removed to expose the top surface of the dummy gate electrode layer 118. In some embodiments, the portion of the ILD layer 142 is removed by a planarizing process, a chemical mechanical polishing (CMP) process.

The S/D structure 138 is in direct contact with the inner spacer layer 136. The inner spacer layer 136 is between the dummy dielectric layer 132 and the S/D structure 138. The S/D structure 138 may include silicon germanium (SiGe), indium arsenide (InAs), indium gallium arsenide (InGaAs), indium antimonide (InSb), gallium arsenide (GaAs), gallium antimonide (GaSb), indium aluminum phosphide (InAlP), indium phosphide (InP), or a combination thereof. The S/D structure 138 may doped with one or more dopants. In some embodiments, the S/D structure 138 is silicon (Si) doped with phosphorus (P), arsenic (As), antimony (Sb), or another applicable dopant. Alternatively, the S/D structure 138 is silicon germanium (SiGe) doped with boron (B) or another applicable dopant.

In some embodiments, the S/D structure 138 is formed by an epitaxy or epitaxial (epi) process. The epi process may include a selective epitaxial growth (SEG) process, CVD deposition techniques (e.g., vapor-phase epitaxy (VPE) and/or ultra-high vacuum CVD (UHV-CVD)), molecular beam epitaxy, or other suitable epi processes.

In some embodiments, the CESL 140 is made of silicon nitride, silicon oxynitride, and/or other applicable materials. The CESL 140 may be formed by plasma enhanced chemical vapor deposition (CVD) process, low pressure CVD process, atomic layer deposition (ALD) process, or another applicable processes.

The ILD layer 142 may include multilayers made of multiple dielectric materials, such as silicon oxide, silicon nitride, silicon oxynitride, phosphosilicate glass (PSG), borophosphosilicate glass (BPSG), low-k dielectric material, and/or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD layer 142 may be formed by chemical vapor deposition (CVD), physical vapor deposition, (PVD), atomic layer deposition (ALD), spin-on coating, or other applicable processes.

Figure 11A:
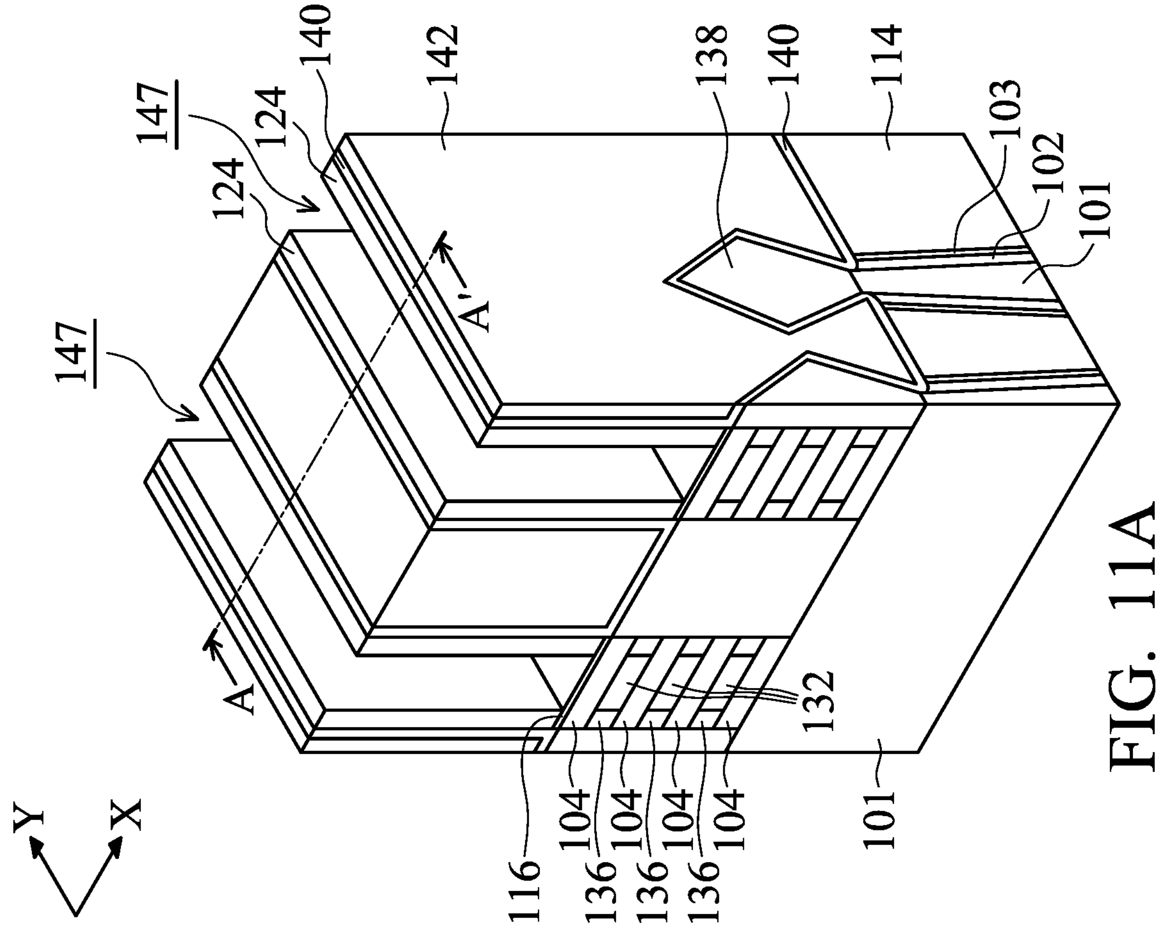
Figure 11B:
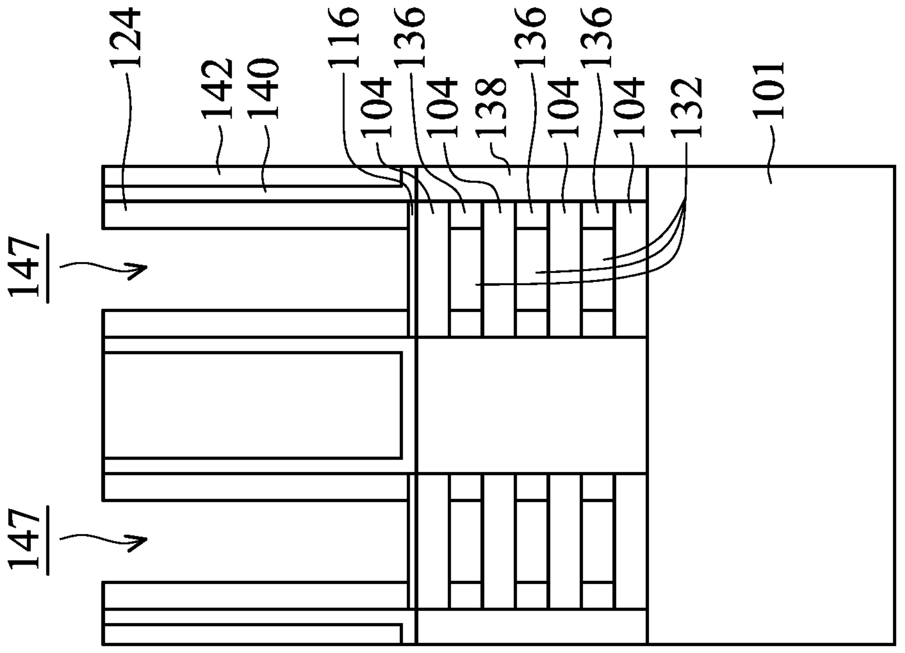

Afterwards, as shown in FIGS. 11A and 11B, the dummy gate electrode layer 118 is removed to form a trench 147, in accordance with some embodiments. As a result, the dummy gate dielectric layer 116 is exposed, and the sidewall surfaces of the gate spacer layer 124 are exposed.

Figure 12A:
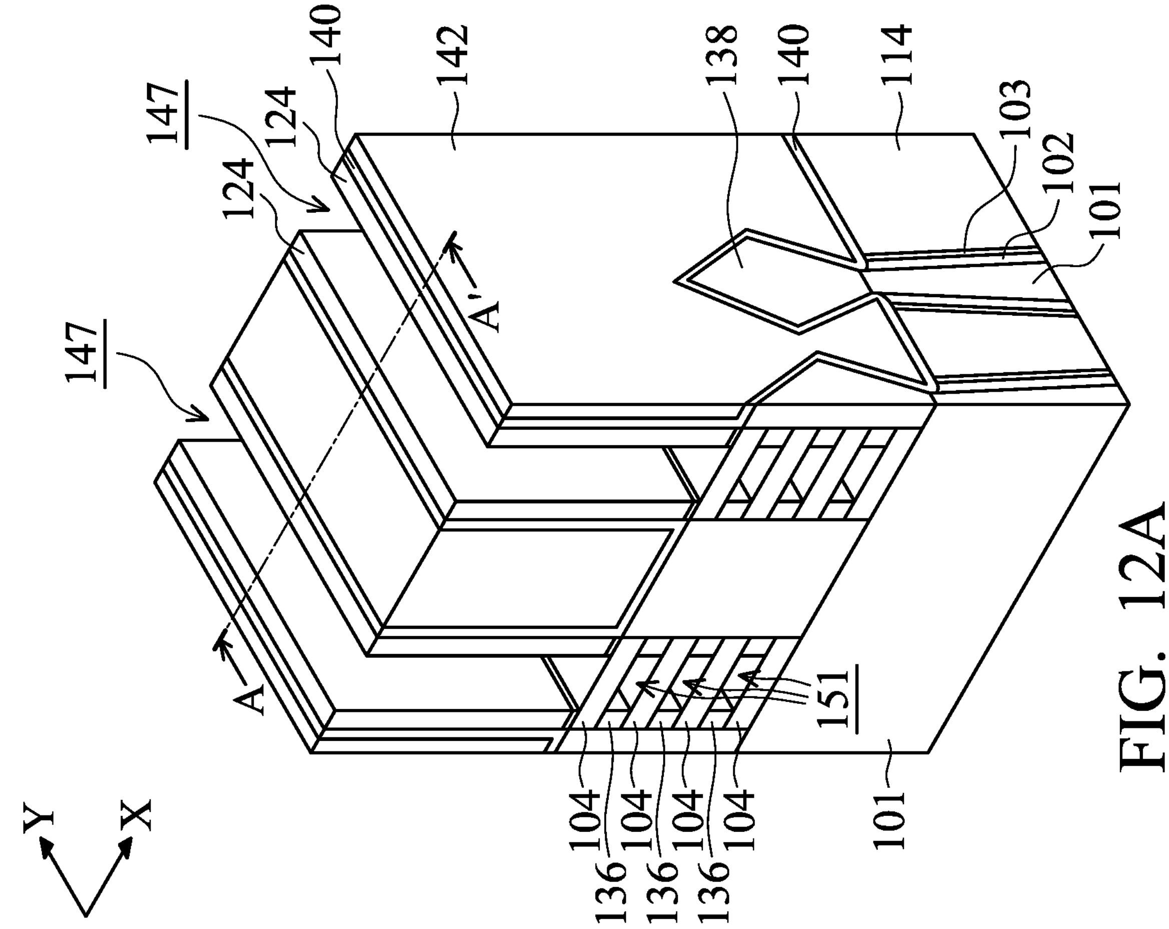
Figure 12B:
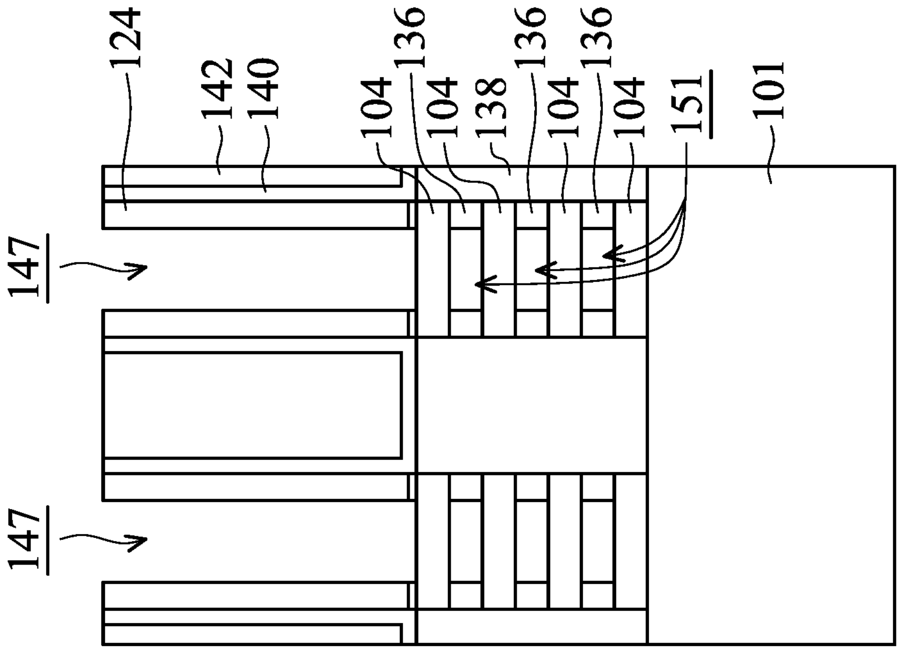

Next, as shown in FIGS. 12A and 12B, the dummy gate dielectric layer 116 is removed, and the dummy dielectric layer 132 is removed to form a number of gaps 151, in accordance with some embodiments. Each of the gaps 151 is formed between two adjacent first semiconductor layers 104.

In some embodiments, the dummy gate dielectric layer 116 and the dummy dielectric layer 132 are simultaneously removed. In some other embodiments, the dummy gate dielectric layer 116 is removed firstly, and then the dummy dielectric layer 132 is removed. In some embodiments, a cleaning process is performed after the gaps 151 are formed. In some embodiments, the cleaning process includes using DI water or diluted-HF solution.

Since the dummy dielectric layer 132 and the inner spacer layer 136 are made of different materials, and the dummy dielectric layer 132 and the inner spacer layer 136 have different etching selectivity, the dummy dielectric layer 132 is removed but the inner space layer 136 is not removed. In some embodiments, the dummy dielectric layer 132 is removed by etching process using HF or $NH_3$.

It should be noted that, the gaps 151 are formed by removing the dummy gate dielectric layer 116, rather than the second semiconductor layers 106. Therefore, the unwanted by-products, such as Ge-containing residue or F-containing residue, which are formed due to removal of the second semiconductor layers 106, are not remaining in the gaps 151. The method of this disclosure provides clean surfaces of the gaps 151, and the clean surfaces are helpful for deposition of a gate structure 160 (shown in FIGS. 13A and 13B).

Figure 13A:
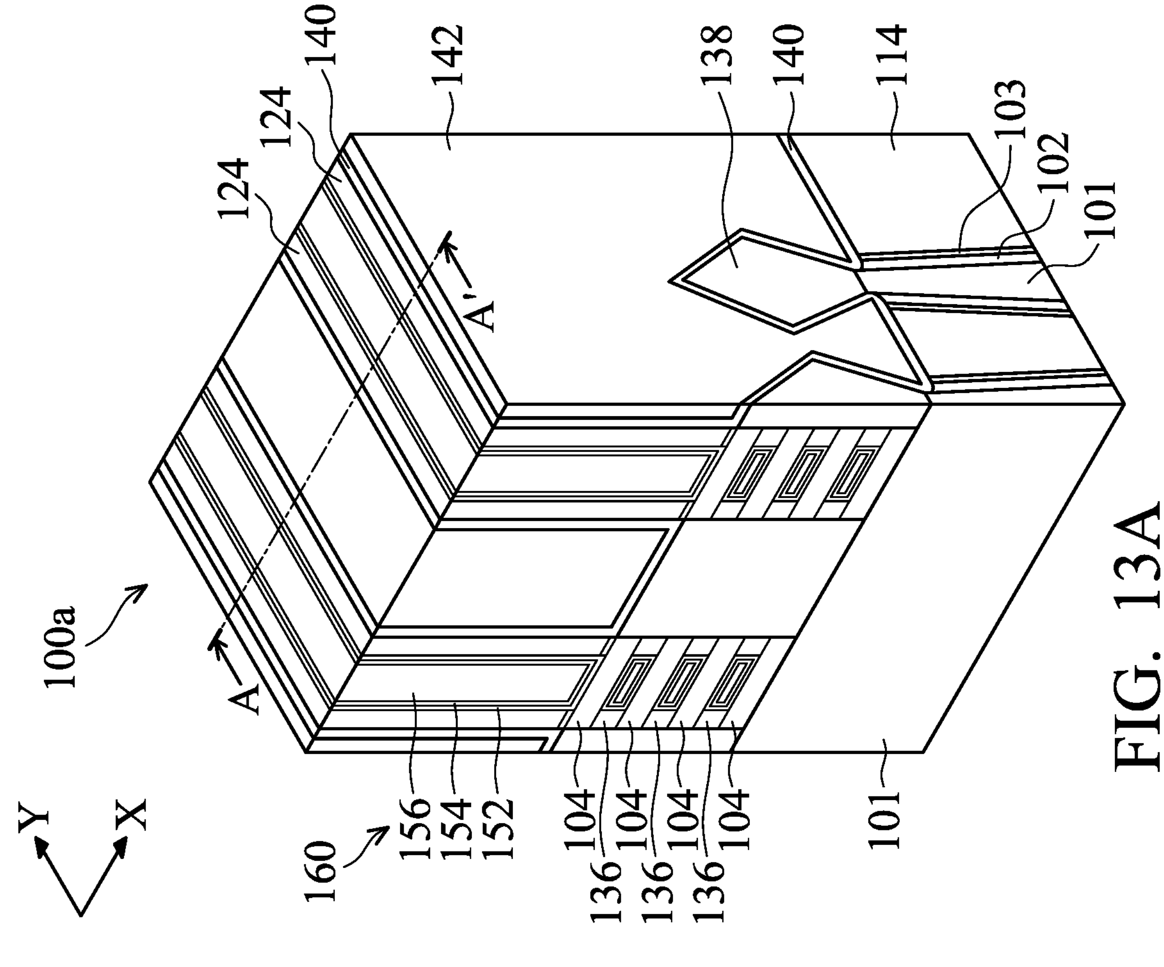

Afterwards, as shown in FIGS. 13A and 13B, a gate structure 160 is formed in the trench 147 and the gap 151, in accordance with some embodiments. The gate structure 160 includes an interfacial layer 152, a gate dielectric layer 154 and a gate electrode layer 156. The inner spacer layer 136 is between the gate structure 160 and the S/D structure 138.

The interfacial layer 152 is conformally formed along the main surfaces of the first semiconductor layers 104 to surround the first semiconductor layers 104. In some embodiments, the interfacial layer 152 is made of a chemically formed silicon oxide.

In some embodiments, the gate dielectric layer 154 is a high-k dielectric layer. In some embodiments, the high-k gate dielectric layer is made of one or more layers of a dielectric material, such as $HfO_2$, HfSiO, HfSiON, HfTaO, HfTiO, HfZrO, zirconium oxide, aluminum oxide, titanium oxide, hafnium dioxide-alumina ($HfO_2$—$Al2O_3$) alloy, another suitable high-k dielectric material, or a combination thereof. In some embodiments, the high-k gate dielectric layer 154 is formed using chemical vapor deposition (CVD), atomic layer deposition (ALD), another suitable method, or a combination thereof.

The gate electrode layer 156 is formed on the gate dielectric layer 154, in accordance with some embodiments. The gate electrode layer 156 fills the gap 151. In some embodiments, the gate electrode layer 156 is made of one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, another suitable material, or a combination thereof. In some embodiments, the gate electrode layer 156 is formed using CVD, ALD, electroplating, another suitable method, or a combination thereof.

It should be noted that the since the second semiconductor layers 106 are replaced by the dummy dielectric layer 132, the etching process for removing the dummy dielectric layer 132 is easily to control. Therefore, the shape or profile of the cavity 135 is well-controlled. In addition, the cavity depth variation is reduced and uniformity of the cavities 135 is improved.

Furthermore, since the gaps 151 are formed by removing the dummy gate dielectric layer 116, rather than the second semiconductor layers 106. Therefore, the unwanted by-products which are formed due to removal of the second semiconductor layers 106, are not remaining in the gaps 151. The method of this disclosure provides clean surfaces of the gaps 151, and the clean surfaces are helpful for deposition of a gate structure 160 (shown in FIGS. 13A and 13B).

FIGS. 14A-16A show perspective representations of various stages of forming a semiconductor device structure 100*b*, in accordance with some embodiments of the disclosure. FIGS. 14B-16B show cross-sectional representations of the semiconductor device structure along line AA' shown in FIG. 14A-16A, in accordance with some embodiments of the disclosure. Processes and materials used to form the semiconductor device structure 100*b* may be similar to, or the same as, those used to form the semiconductor device structure 100*a* and are not repeated herein.

Figure 14A:
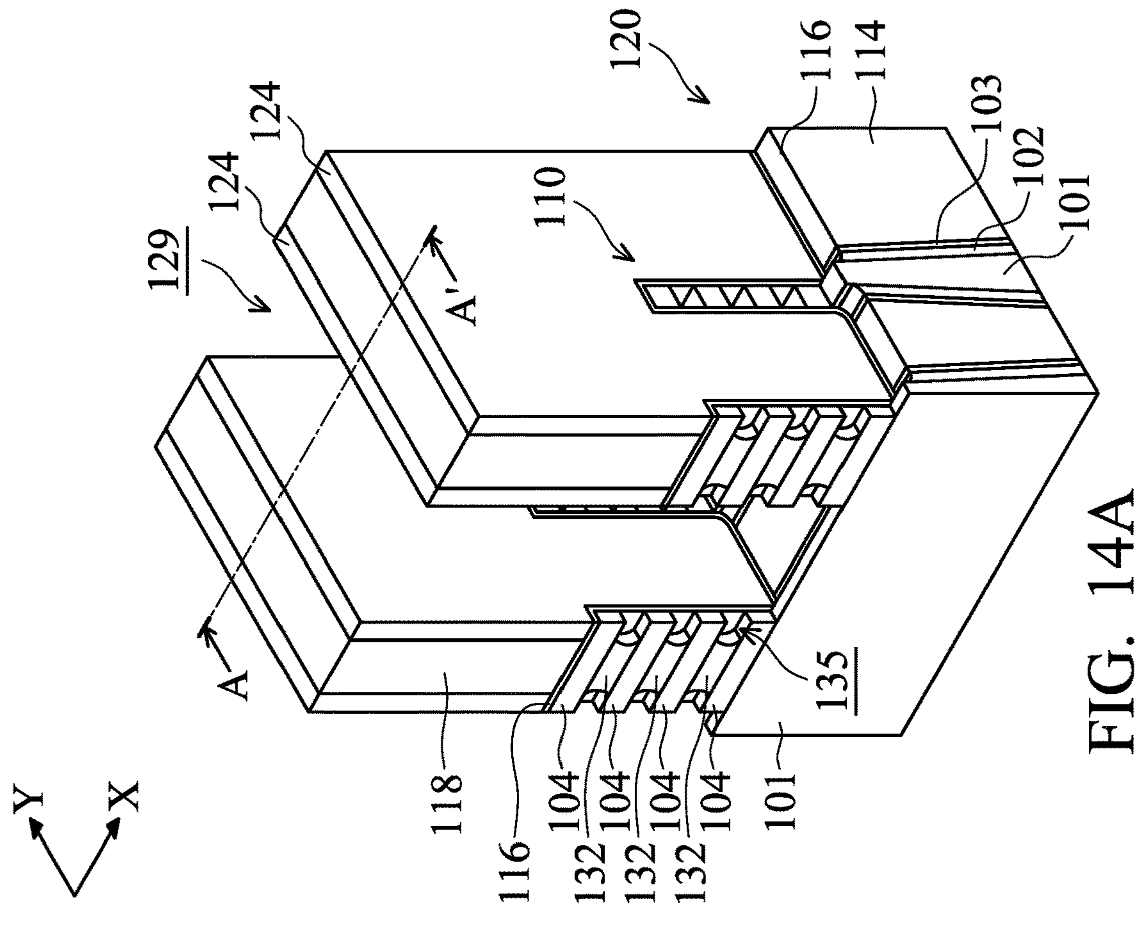
Figure 14B:
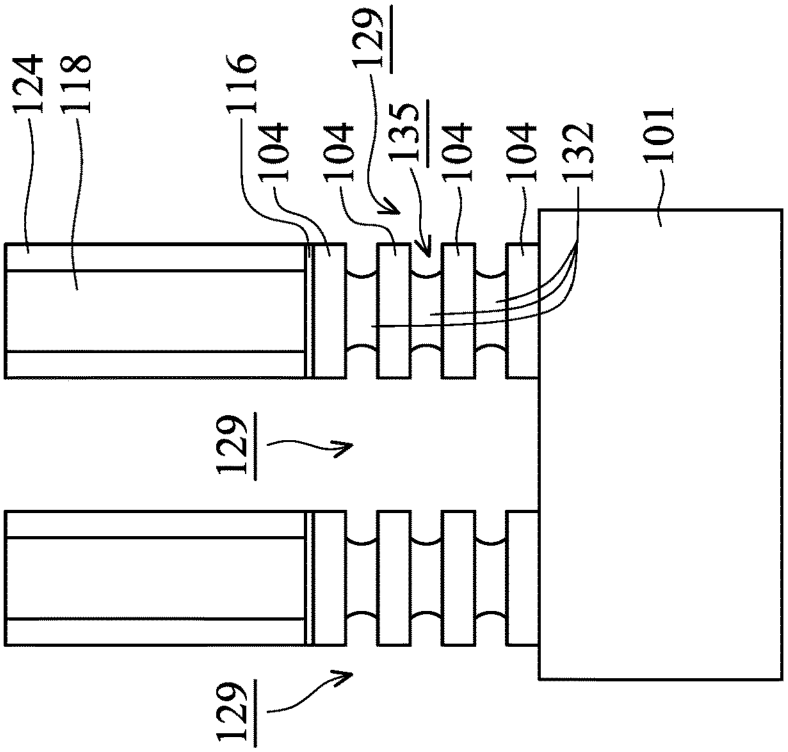

The semiconductor device structure 100*b* of FIG. 14A is similar to the semiconductor device structure of FIG. 7A, the differences between FIG. 14A and FIG. 7A are that the shapes of cavities 135 in FIG. 14A have curved sidewall surfaces. The sidewall surfaces of the cavities 135 in FIG. 14A are more smooth than the sidewall surfaces of the cavities 135 in FIG. 7A. In some embodiments, the cavity 135 in FIG. 14A has a U-shaped structure. In some embodiments, the cavity 135 in FIG. 14A does not have V-shaped structure.

Figure 15C:
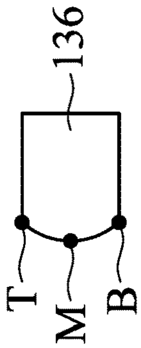
FIG. 15C shows a cross-sectional representation of the semiconductor device structure in region A of FIG. 15B, in accordance with some embodiments of the disclosure.
Figure 15B:
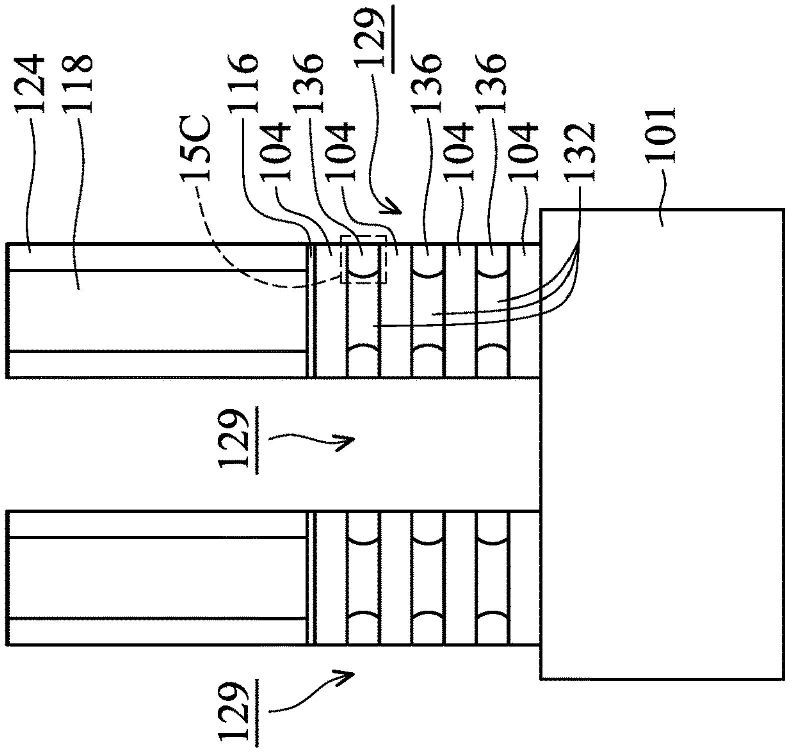
Figure 15A:
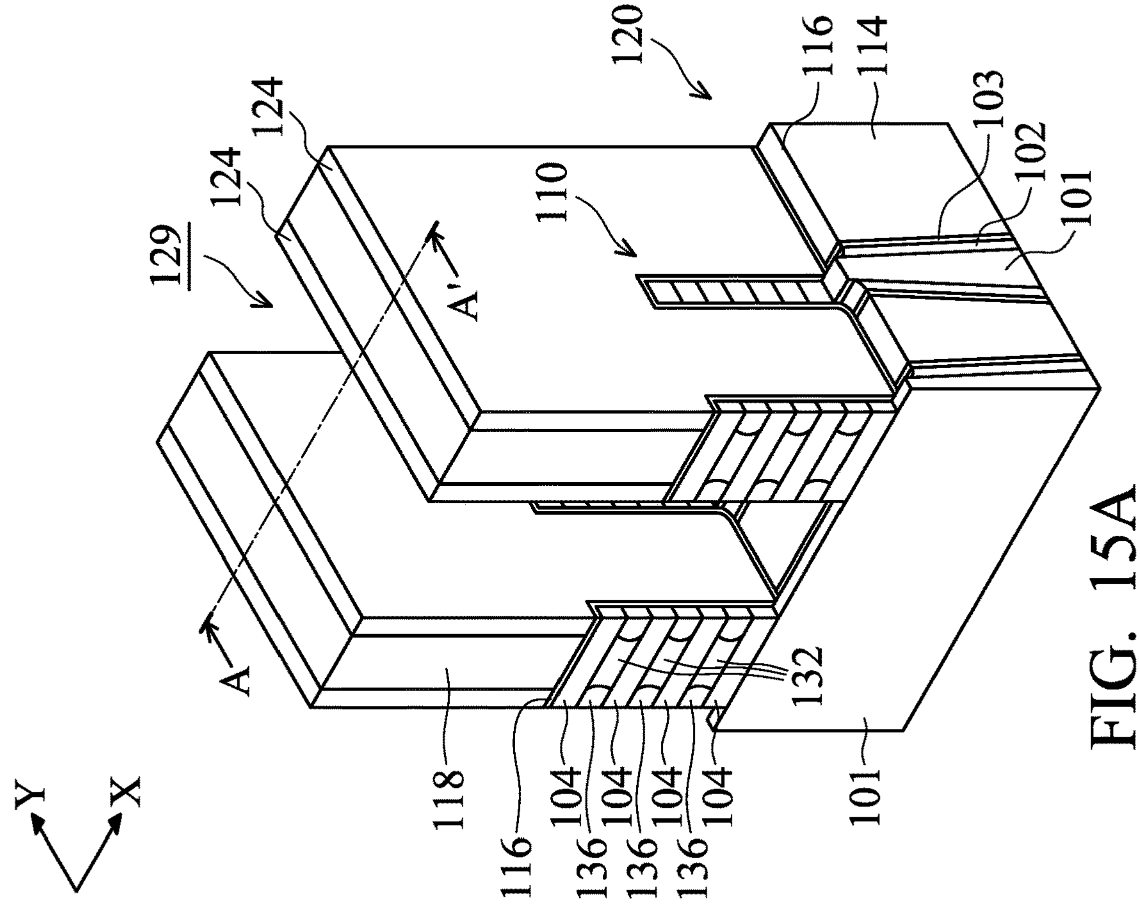

Next, as shown in FIGS. 15A and 15B, the inner spacer layer 136 is formed in the cavities 135, in accordance with some embodiments of the disclosure. The inner spacer layer 136 has a curved surface that protrudes toward the dummy dielectric layer 132. In some embodiments, the inner spacer layer 136 has convex shape.

FIG. 15C shows a cross-sectional representation of the semiconductor device structure in region A of FIG. 15B, in accordance with some embodiments of the disclosure. As shown in FIG. 15C, in some embodiments, the inner space layer 136 has a convex shape with a curved surface. The curved surface includes a top point T, a middle point M and a bottom point B. The middle point M is closer to the dummy dielectric layer 132 than the top point T and the bottom point B. The middle point M is at a position which is at half height of the inner spacer layer 136.

The inner sidewall surface of the inner spacer layer 136 in direct contact with the dummy dielectric layer 132 is curved. The outer sidewall surface of the inner spacer layer 136 in substantially aligned with the sidewall surface of one of the first semiconductor layers 104. The inner sidewall surface of the inner spacer layer 136 is asymmetric to the outer sidewall surface of the inner spacer layer 136.

Figure 16B:
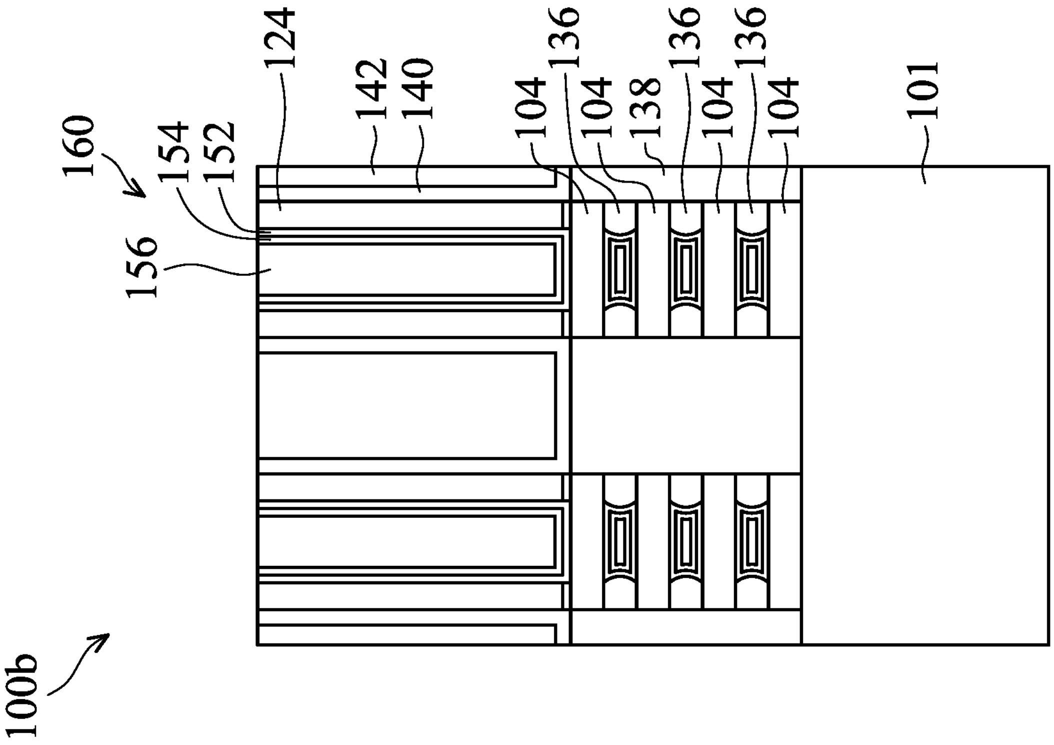
Figure 16A:
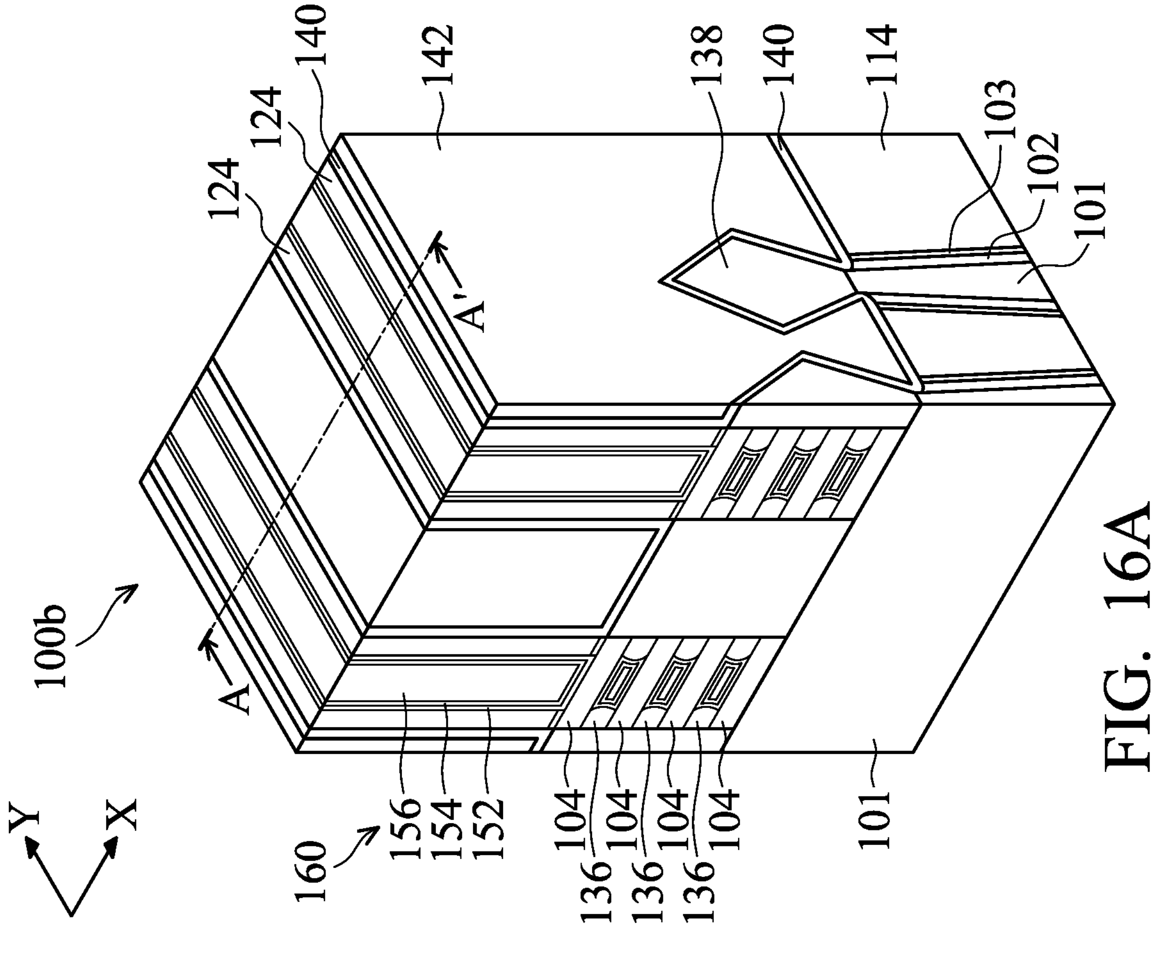

Afterwards, as shown in FIGS. 16A and 16B, the gate structure 160 is formed to replace the dummy dielectric layer 132, in accordance with some embodiments of the disclosure. The gate structure 160 includes the interfacial layer 152, the gate dielectric layer 154 and the gate electrode layer 156. The inner spacer layer 136 is between the gate structure 160 and the S/D structure 138.

It should be noted that the second semiconductor layers 106 are removed firstly, then the dummy dielectric layer 132 is formed to replace the second semiconductor layers 106. The etching process for removing the dummy dielectric layer 132 is easily controlled than removing the second semiconductor layers 106. Therefore, the etching profile of the cavities 135 is well-controlled.

Figure 17B:
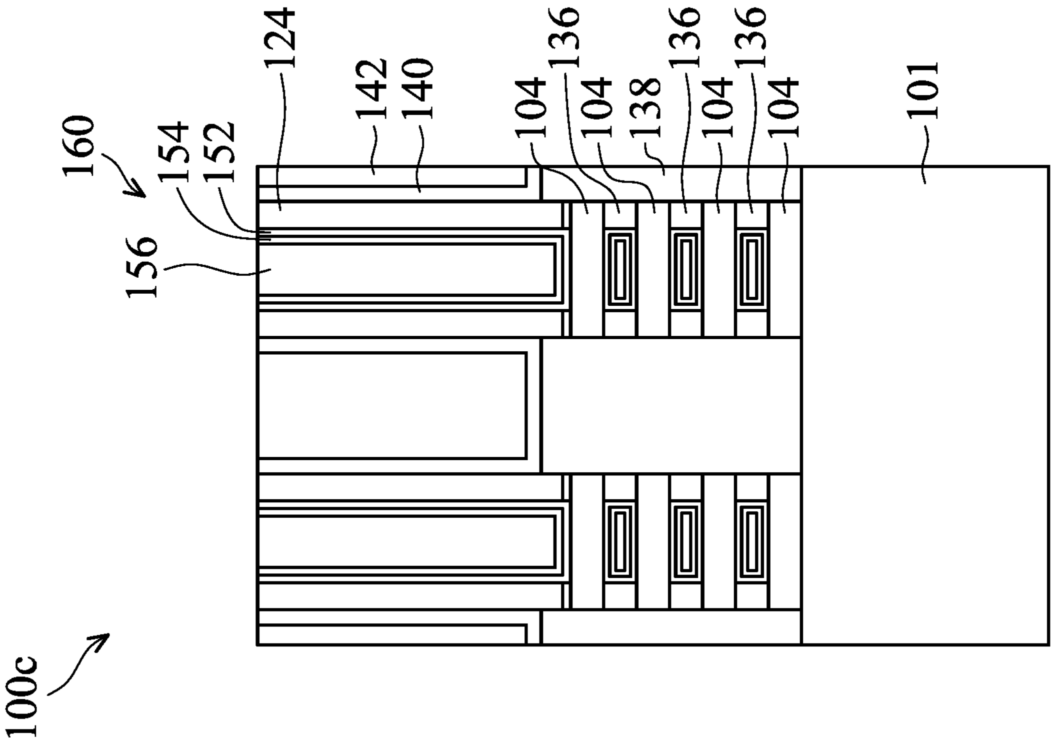
FIG. 17B shows a cross-sectional representation of the semiconductor device structure along line AA' shown in FIG. 17A, in accordance with some embodiments of the disclosure.
Figure 17A:
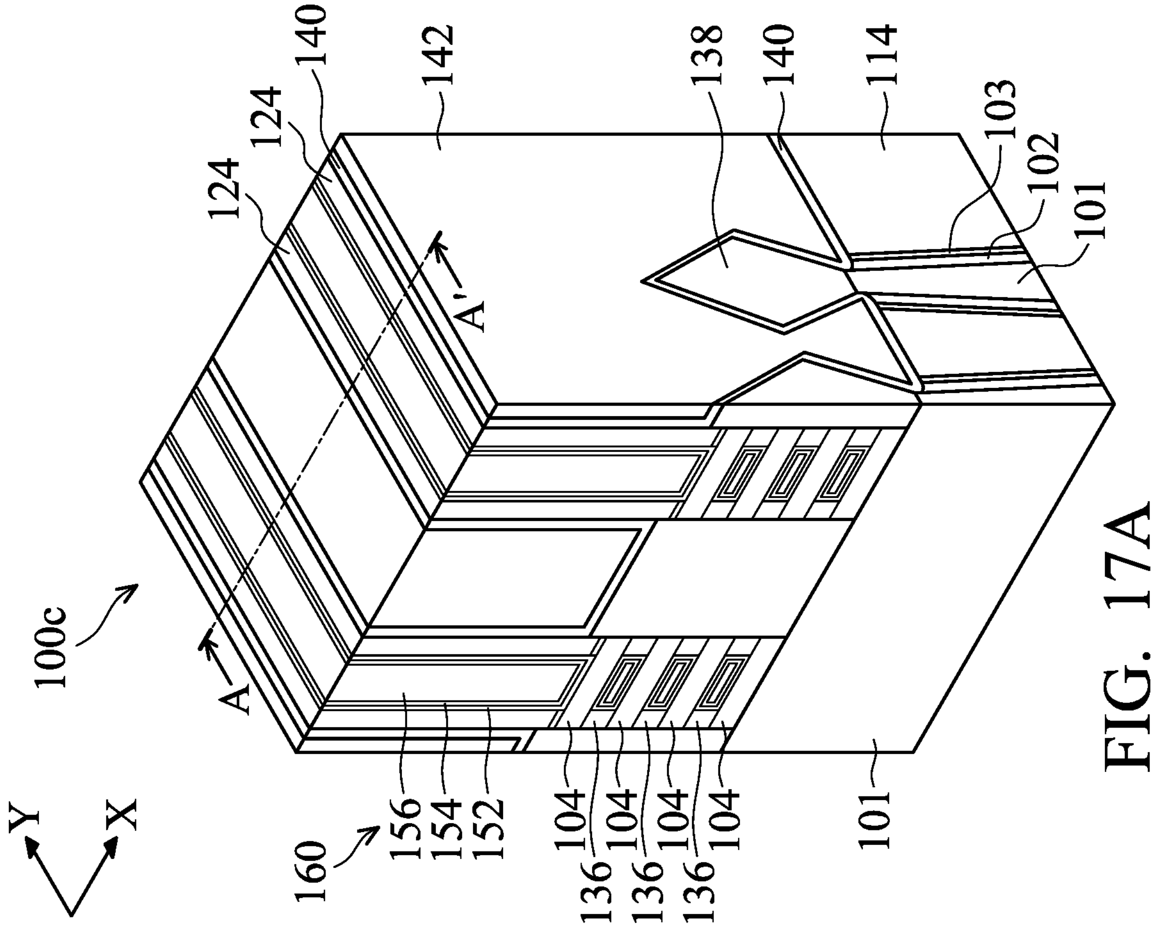
FIG. 17A shows a perspective representation of a semiconductor device structure, in accordance with some embodiments of the disclosure.

FIG. 17A shows a perspective representation of a semiconductor device structure 100*c*, in accordance with some embodiments of the disclosure. FIG. 17B shows a cross-sectional representation of the semiconductor device structure along line AA' shown in FIG. 17A, in accordance with some embodiments of the disclosure. Processes and materials used to form the semiconductor device structure 100*c* may be similar to, or the same as, those used to form the semiconductor device structure 100*a* and are not repeated herein.

The semiconductor device structure 100*b* of FIG. 17A is similar to the semiconductor device structure of FIG. 13A, the differences between FIG. 17A and FIG. 13A are that the S/D structure 138 is higher than a top surface of the topmost first semiconductor layers 104. The top surface of the S/D structure 138 is higher than a bottom surface of the interfacial layer 152.

Embodiments for forming a semiconductor device structure and method for formation the same are provided. The semiconductor structure includes a number of the first semiconductor layers and a number of the second semiconductor layers alternately stacked. A dummy gate structure is formed over the first semiconductor layers and a number of the second semiconductor layers. The second semiconductor layers are removed and replaced by a dummy dielectric layer. A portion of the dummy dielectric layer is removed to form a cavity, and the cavity is filled into an inner spacer layer. An S/D structure is formed in the cavity. The dummy gate structure is removed firstly, and then the dummy dielectric layer is removed to form gap. The gate structure is formed in the gap.

Since the second semiconductor layers are replaced by the dummy dielectric layer, the etching process for removing the dummy dielectric layer is well-controlled. Each of the cavities has a substantially consistent shape or profile and the cavity depth variation is reduced. In addition, the gap is formed by removing the dummy gate dielectric layer, rather than the second semiconductor layers. Therefore, the unwanted by-products, which are formed due to removal of the second semiconductor layers, are not remaining in the gap. The method of this disclosure provides clean surfaces of the gap, and the clean surfaces are helpful for deposition of the gate structure. Therefore, the performance of semiconductor device structure is improved.

In some embodiments, a method for forming a semiconductor device structure is provided. The method includes forming a plurality of first semiconductor layers and a plurality of second semiconductor layers on a substrate, and the first semiconductor layers and the second semiconductor layers are alternately stacked. The method also includes forming a dummy gate structure over the first semiconductor layers and the second semiconductor layers. The method further includes removing a portion of the first semiconductor layers and second semiconductor layers to form a trench, and removing the second semiconductor layers to form a recess between two adjacent first semiconductor layers. The method includes forming a dummy dielectric layer in the recess, and removing a portion of the dummy dielectric layer to form a cavity. The method also includes forming an inner spacer layer in the cavity.

In some embodiments, a method for forming a semiconductor device structure is provided. The method includes forming a fin structure over a substrate, and the fin structure includes a plurality of first semiconductor layers and a plurality of second semiconductor layers alternately stacked.

The method also includes forming a dummy gate structure over the fin structure, and removing a portion of the fin structure to form a recess between two adjacent first semiconductor layers. The method further includes forming a dummy dielectric layer in the recess, so that the first semiconductor layers and the dummy dielectric layer are alternately stacked. The method includes removing a portion of the dummy dielectric layer to form a cavity, and forming an inner spacer layer in the cavity. The method includes forming an S/D structure adjacent to the inner spacer layer, and removing the dummy dielectric layer to form a gap. The method includes forming a gate structure in the gap, and the inner spacer layer is between the gate structure and the S/D structure.

In some embodiments, a method for forming a semiconductor device structure is provided. The method includes forming a plurality of first semiconductor layers and a plurality of second semiconductor layers on a substrate, and the first semiconductor layers and the second semiconductor layers are alternately stacked. The method includes forming a dummy gate dielectric layer and a gate electrode layer over the first semiconductor layers and the second semiconductor layers, and removing the second semiconductor layers to form a recess between two adjacent first semiconductor layers. The method also includes forming a dummy dielectric layer in the recess, and the dummy dielectric layer is between two adjacent first semiconductor layers. The method includes removing the gate electrode layer, and removing the gate dielectric layer. The method includes removing the dummy dielectric layer to form a gap, and forming a gate structure in the gap. The dummy dielectric layer is replaced by the gate structure.

In some embodiments, a method for forming a semiconductor device structure is provided. The method includes forming a plurality of first semiconductor layers and a plurality of second semiconductor layers on a substrate, and the first semiconductor layers and the second semiconductor layers are alternately stacked. The method also includes forming a dummy gate structure over the first semiconductor layers and the second semiconductor layers, and removing a portion of the first semiconductor layers and second semiconductor layers to form a source/drain (S/D) trench. The method also includes removing the second semiconductor layers to form a recess, and the recess is connected to the S/D trench. The method includes forming a dummy dielectric layer in the recess after the dummy gate structure is formed, and the dummy dielectric layer is exposed by the S/D trench. The method includes removing a portion of the dummy dielectric layer to form a cavity and forming an inner spacer layer in the cavity.

In some embodiments, a method for forming a semiconductor device structure is provided. The method includes forming a fin structure over a substrate, and the fin structure includes a plurality of first semiconductor layers and a plurality of second semiconductor layers alternately stacked. The method also includes forming a dummy gate structure over the fin structure, and forming a gate spacer adjacent to the dummy gate structure. The method includes removing a portion of the fin structure to form a recess between two adjacent first semiconductor layers, and forming a dummy dielectric layer in the recess after the gate spacer is formed, so that the first semiconductor layers and the dummy dielectric layer are alternately stacked. The method includes removing a portion of the dummy dielectric layer to form a cavity, and forming an inner spacer layer in the cavity and on the gate spacer and the dummy gate structure. The method includes forming an S/D structure adjacent to the inner spacer layer.

In some embodiments, a method for forming a semiconductor device structure is provided. The method includes forming first semiconductor layers and the second semiconductor layers over a substrate, and forming a dummy gate dielectric layer and a dummy gate electrode layer over the first semiconductor layers and the second semiconductor layers. The method includes removing the entire second semiconductor layers to form a recess (between two adjacent first semiconductor layers, and forming a dummy layer in the recess after the dummy gate dielectric layer and the dummy gate electrode layer are formed, and the dummy layer is between two adjacent first semiconductor layers. The method includes forming a S/D structure adjacent to the dummy layer, and the S/D structure is isolated from the dummy layer by an inner spacer. The method includes removing the dummy gate electrode layer, and removing the dummy gate dielectric layer and simultaneously removing the entire dummy dielectric layer to form a gap. The method also includes forming a gate structure in the gap, wherein the dummy layer is replaced by the gate structure, and the gate structure is isolated from the S/D structure by the inner spacer, and an interface between the gate structure and the inner spacer is curved.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
- forming a plurality of first semiconductor layers and a plurality of second semiconductor layers on a substrate, wherein the first semiconductor layers and the second semiconductor layers are alternately stacked;
- forming a dummy gate structure over the first semiconductor layers and the second semiconductor layers;
- removing a portion of the first semiconductor layers and second semiconductor layers to form a source/drain (S/D) trench;
- removing the second semiconductor layers to form a recess, wherein the recess is connected to the S/D trench;
- forming a dummy dielectric layer in the recess after the dummy gate structure is formed, wherein the dummy dielectric layer is exposed by the S/D trench;
- removing a portion of the dummy dielectric layer to form a cavity; and
- forming an inner spacer layer in the cavity.

2. The method for forming the semiconductor device structure as claimed in claim 1, further comprising:
- forming an S/D structure in the S/D trench, wherein the S/D structure is in direct contact with the inner spacer layer.

3. The method for forming the semiconductor device structure as claimed in claim 2, further comprising:

forming a liner on sidewall surfaces of the first semiconductor layers and the second semiconductor layers, wherein the liner is in direct contact with the S/D structure.

4. The method for forming the semiconductor device structure as claimed in claim 1, further comprising:

forming a gate spacer adjacent to the dummy gate structure, wherein a sidewall of the gate spacer is aligned with a sidewall of the dummy dielectric layer.

5. The method for forming the semiconductor device structure as claimed in claim 1, further comprising:

removing the dummy gate structure; and removing the entire dummy dielectric layer after removing the dummy gate structure.

6. The method for forming the semiconductor device structure as claimed in claim 5, wherein the dummy gate structure comprises a dummy gate dielectric layer and a dummy gate electrode layer over the dummy gate dielectric layer, and the method comprises:

removing the dummy gate electrode layer; and removing the dummy gate dielectric layer and simultaneously removing the entire dummy dielectric layer.

7. The method for forming the semiconductor device structure as claimed in claim 1, further comprising:

forming the inner spacer layer over the dummy gate structure and the substrate.

8. The method for forming the semiconductor device structure as claimed in claim 1, wherein an interface between the dummy dielectric layer and the inner spacer layer is curved.

9. A method for forming a semiconductor device structure, comprising:

forming a fin structure over a substrate, wherein the fin structure comprises a plurality of first semiconductor layers and a plurality of second semiconductor layers alternately stacked;

forming a dummy gate structure over the fin structure;

forming a gate spacer adjacent to the dummy gate structure;

removing a portion of the fin structure to form a recess between two adjacent first semiconductor layers;

forming a dummy dielectric layer in the recess after the gate spacer is formed, so that the first semiconductor layers and the dummy dielectric layer are alternately stacked;

removing a portion of the dummy dielectric layer to form a cavity;

forming an inner spacer layer in the cavity and on the gate spacer and the dummy gate structure; and forming an S/D structure adjacent to the inner spacer layer.

10. The method for forming the semiconductor device structure as claimed in claim 9, further comprising:

removing a portion of the first semiconductor layers and second semiconductor layers to form a trench before forming the dummy dielectric layer; and forming the S/D structure in the trench.

11. The method for forming the semiconductor device structure as claimed in claim 9, further comprising:

forming an etch stop layer on the S/D structure; and forming a ILD layer on the etch stop layer.

12. The method for forming the semiconductor device structure as claimed in claim 11, further comprising:

removing the dummy gate structure after forming the ILD layer; and removing the entire dummy dielectric layer after removing the dummy gate structure.

13. The method for forming the semiconductor device structure as claimed in claim 9, wherein the cavity is directly below the gate spacer.

14. The method for forming the semiconductor device structure as claimed in claim 9, wherein the dummy gate structure comprises a dummy gate dielectric layer and a dummy gate electrode layer over the dummy gate dielectric layer, and the method comprises:

removing the dummy gate electrode layer; and simultaneously removing the dummy gate dielectric layer and the entire dummy dielectric layer.

15. The method for forming the semiconductor device structure as claimed in claim 9, wherein an interface between the dummy dielectric layer and the inner spacer layer is curved.

16. A method for forming a semiconductor device structure, comprising:

forming first semiconductor layers and the second semiconductor layers over a substrate;

forming a dummy gate dielectric layer and a dummy gate electrode layer over the first semiconductor layers and the second semiconductor layers;

removing the entire second semiconductor layers to form a recess between two adjacent first semiconductor layers;

forming a dummy layer in the recess after the dummy gate dielectric layer and the dummy gate electrode layer are formed, wherein the dummy layer is between two adjacent first semiconductor layers;

forming a S/D structure adjacent to the dummy layer, wherein the S/D structure is isolated from the dummy layer by an inner spacer;

removing the dummy gate electrode layer;

removing the dummy gate dielectric layer and simultaneously removing the entire dummy dielectric layer to form a gap; and forming a gate structure in the gap, wherein the dummy layer is replaced by the gate structure, wherein the gate structure is isolated from the S/D structure by the inner spacer, and an interface between the gate structure and the inner spacer is curved.

17. The method for forming the semiconductor device structure as claimed in claim 16, further comprising:

removing a portion of the dummy layer to form a cavity; and forming the inner spacer layer in the cavity, wherein the inner spacer layer is in direct contact with the dummy layer.

18. The method for forming the semiconductor device structure as claimed in claim 16, further comprising:

forming a liner on sidewall surfaces of the first semiconductor layers and the second semiconductor layers, wherein the liner is in direct contact with the S/D structure.

19. The method for forming the semiconductor device structure as claimed in claim 18 further comprising:

forming an etching stop layer over the S/D structure, wherein the etch stop layer is in direct contact with the liner.

20. The method for forming the semiconductor device structure as claimed in claim 16, further comprising:

forming a first gate spacer layer and a second gate spacer layer adjacent to the dummy gate electrode layer, wherein the recess extends from a first sidewall of the first gate spacer layer to a second sidewall of the second gate spacer layer.

* * * * *